US012660632B2

(12) United States Patent
    Bakshi et al.

(10) Patent No.: US 12,660,632 B2
(45) Date of Patent: Jun. 16, 2026

(54) MARCHAND BALUNS IN CORELESS PACKAGE SUBSTRATES

(71) Applicant: TEXAS INSTRUMENTS INCORPORATED, Dallas, TX (US)

(72) Inventors: Harshpreet Singh Phull Bakshi, Dallas, TX (US); Sylvester Ankamah-Kusi, Dallas, TX (US); Siraj Akhtar, Dallas, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 388 days.

(21) Appl. No.: 18/345,296

(22) Filed: Jun. 30, 2023

(65) Prior Publication Data

US 2024/0071959 A1    Feb. 29, 2024

Related U.S. Application Data

(60) Provisional application No. 63/401,904, filed on Aug. 29, 2022.

(51) Int. Cl.
    *H01L 23/64*        (2006.01)
    *H01L 21/02*        (2006.01)
    (Continued)

(52) U.S. Cl.
    CPC .......... *H01L 23/645* (2013.01); *H01L 21/022* (2013.01); *H01L 21/288* (2013.01); *H01L 21/3205* (2013.01); *H01L 21/565* (2013.01); *H01L 21/76877* (2013.01); *H01L 23/3107* (2013.01); *H01L 23/49816* (2013.01); *H01L*

23/49822 (2013.01); *H01L 23/49838* (2013.01); *H01L 25/16* (2013.01)

(58) Field of Classification Search
    CPC .......... H01L 23/3107; H01L 23/49816; H01L 23/49822; H01L 23/49838; H01L 23/64; H01L 23/3128; H01L 25/16; H01L 21/6835; H01L 21/3205; H01L 21/565; H01L 21/76877
    See application file for complete search history.

(56) References Cited

U.S. PATENT DOCUMENTS

| | | | | | |
|---|---|---|---|---|---|
| 8,341,835 B1 * | 1/2013 | Huemoeller | ........ | H01L 23/3135 |
| | | | | | 29/841 |
| 11,595,008 B2 * | 2/2023 | Jain | .......................... | H03F 1/26 |

(Continued)

*Primary Examiner* — Alexander G Ghyka

(74) *Attorney, Agent, or Firm* — Dawn Jos; Frank D. Cimino

(57) ABSTRACT

In examples, a semiconductor package comprises a conductive terminal; a semiconductor die including a device side having circuitry formed therein, the device side facing toward the conductive terminal; and a substrate coupled to the conductive terminal and to the device side of the semiconductor die. The substrate includes a first metal layer coupled to first and second vias extending toward and coupled to either the device side of the semiconductor die or the conductive terminal. The substrate includes a second metal layer electrically isolated from the first metal layer by an insulation layer between the first and second metal layers, the second metal layer coupled to a third via extending toward and coupled to either the conductive terminal or the semiconductor die. The first and second metal layers form a Marchand balun.

13 Claims, 34 Drawing Sheets

(51) Int. Cl.

| | | |
|---|---|---|
| *H01L 21/288* | (2006.01) | |
| *H01L 21/3205* | (2006.01) | |
| *H01L 21/56* | (2006.01) | |
| *H01L 21/768* | (2006.01) | |
| *H01L 23/31* | (2006.01) | |
| *H01L 23/498* | (2006.01) | |
| *H01L 25/16* | (2023.01) | |

(56) References Cited

U.S. PATENT DOCUMENTS

| | | | |
|---|---|---|---|
| 2003/0137383 A1* | 7/2003 | Yang | H03H 7/42 |
| | | | 336/200 |
| 2004/0178854 A1* | 9/2004 | Inoue | H03F 1/565 |
| | | | 330/302 |
| 2012/0119845 A1* | 5/2012 | Lu | H01F 21/12 |
| | | | 333/26 |
| 2019/0180916 A1* | 6/2019 | Tseng | H03H 1/00 |
| 2019/0304889 A1* | 10/2019 | Jiao | H01L 21/6835 |
| 2024/0429586 A1* | 12/2024 | Kang | H01P 5/1007 |

* cited by examiner

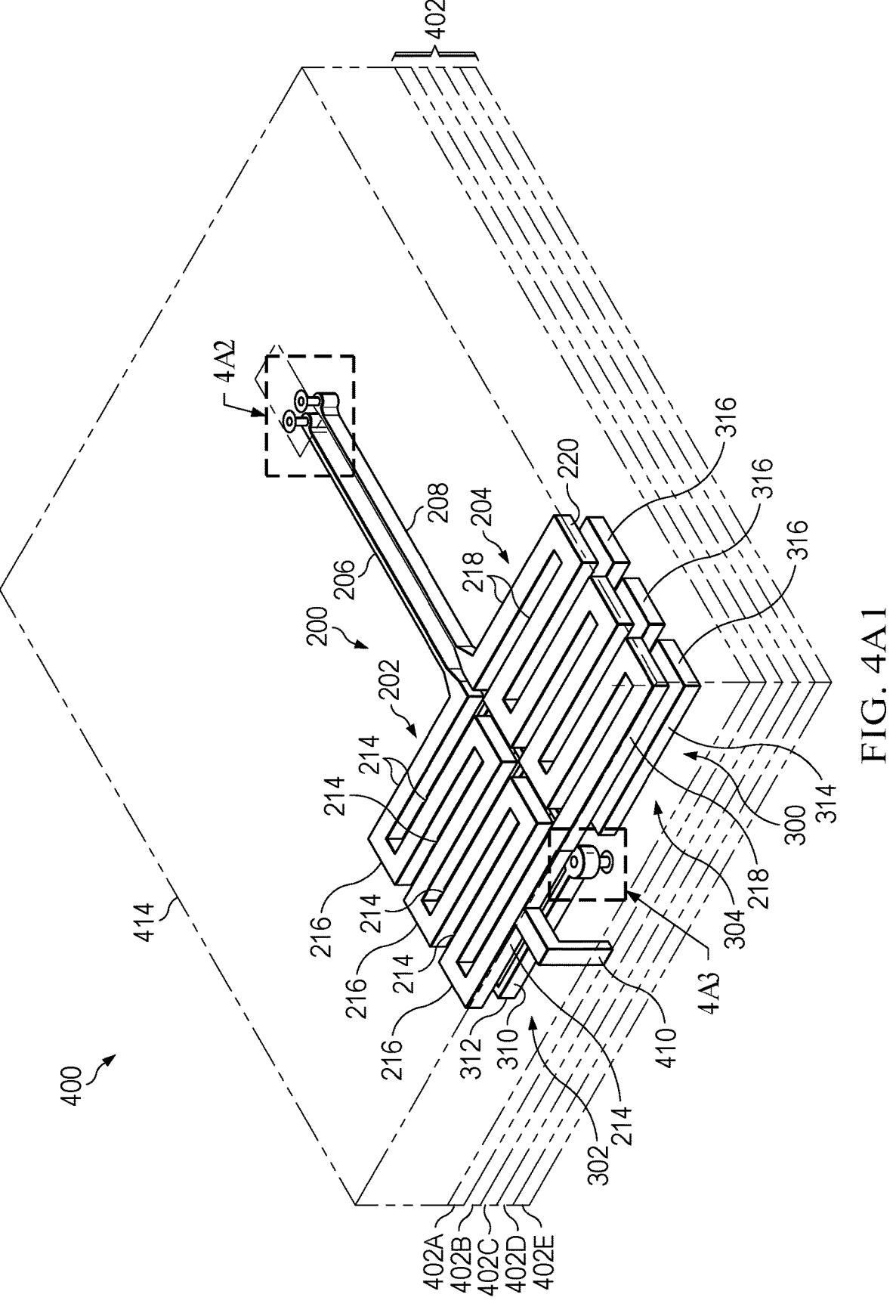
FIG. 4A1

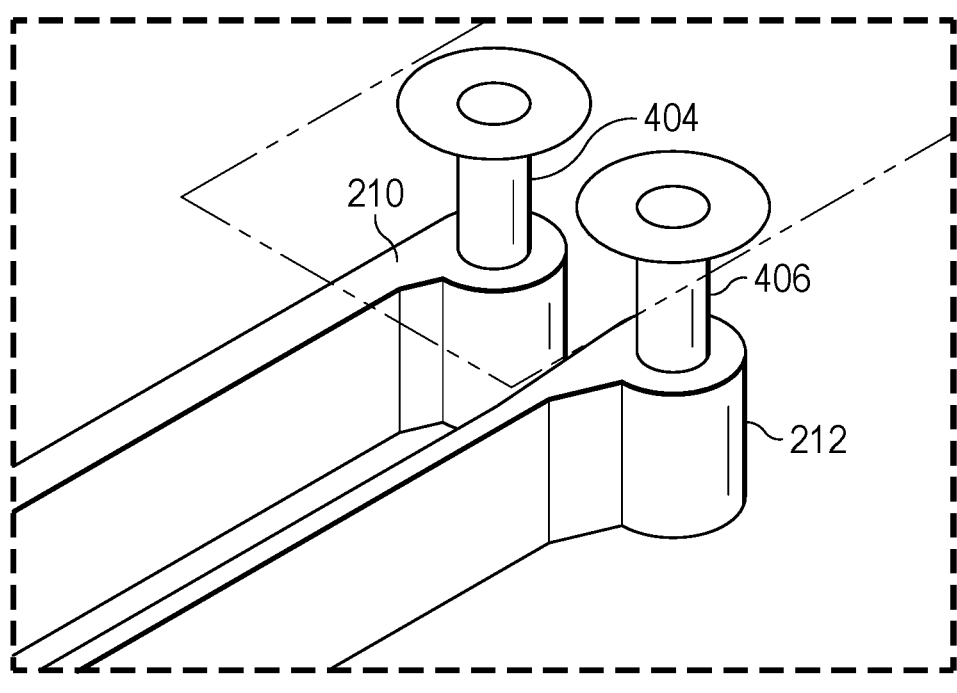
FIG. 4A2
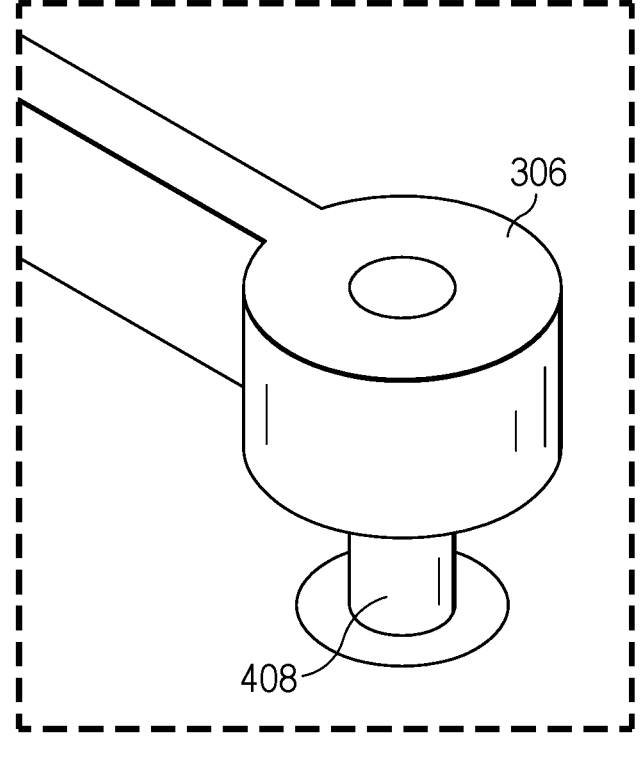
FIG. 4A3

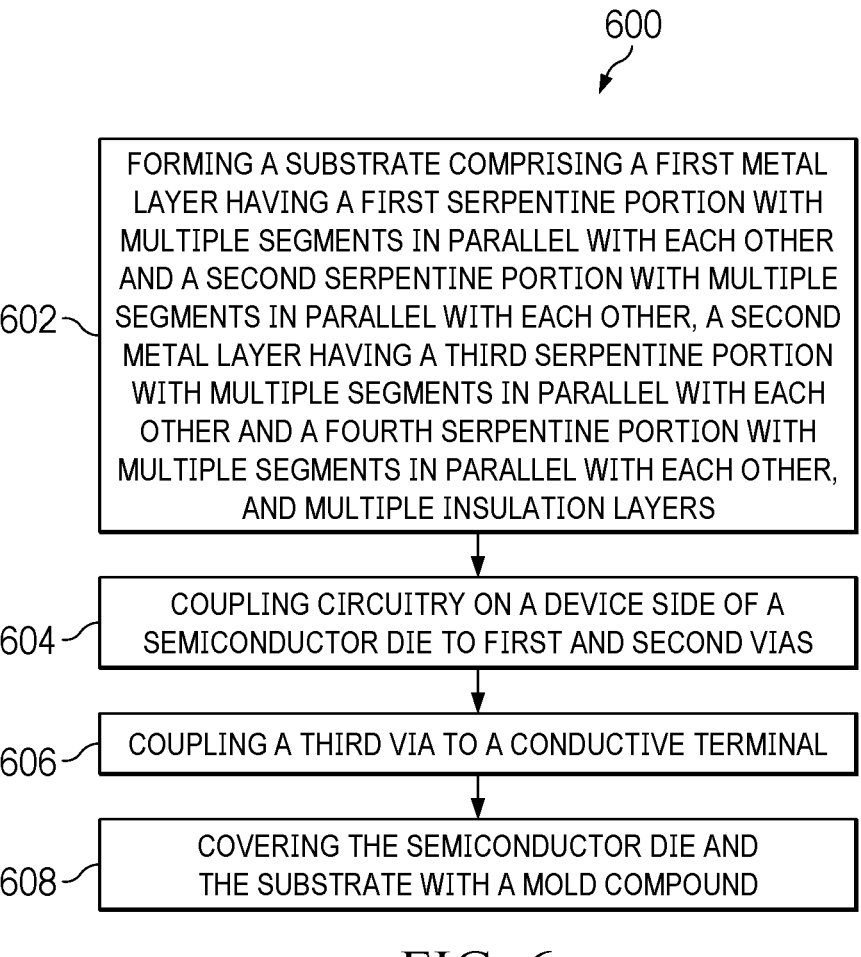

*600*

602 — FORMING A SUBSTRATE COMPRISING A FIRST METAL LAYER HAVING A FIRST SERPENTINE PORTION WITH MULTIPLE SEGMENTS IN PARALLEL WITH EACH OTHER AND A SECOND SERPENTINE PORTION WITH MULTIPLE SEGMENTS IN PARALLEL WITH EACH OTHER, A SECOND METAL LAYER HAVING A THIRD SERPENTINE PORTION WITH MULTIPLE SEGMENTS IN PARALLEL WITH EACH OTHER AND A FOURTH SERPENTINE PORTION WITH MULTIPLE SEGMENTS IN PARALLEL WITH EACH OTHER, AND MULTIPLE INSULATION LAYERS

604 — COUPLING CIRCUITRY ON A DEVICE SIDE OF A SEMICONDUCTOR DIE TO FIRST AND SECOND VIAS

606 — COUPLING A THIRD VIA TO A CONDUCTIVE TERMINAL

608 — COVERING THE SEMICONDUCTOR DIE AND THE SUBSTRATE WITH A MOLD COMPOUND

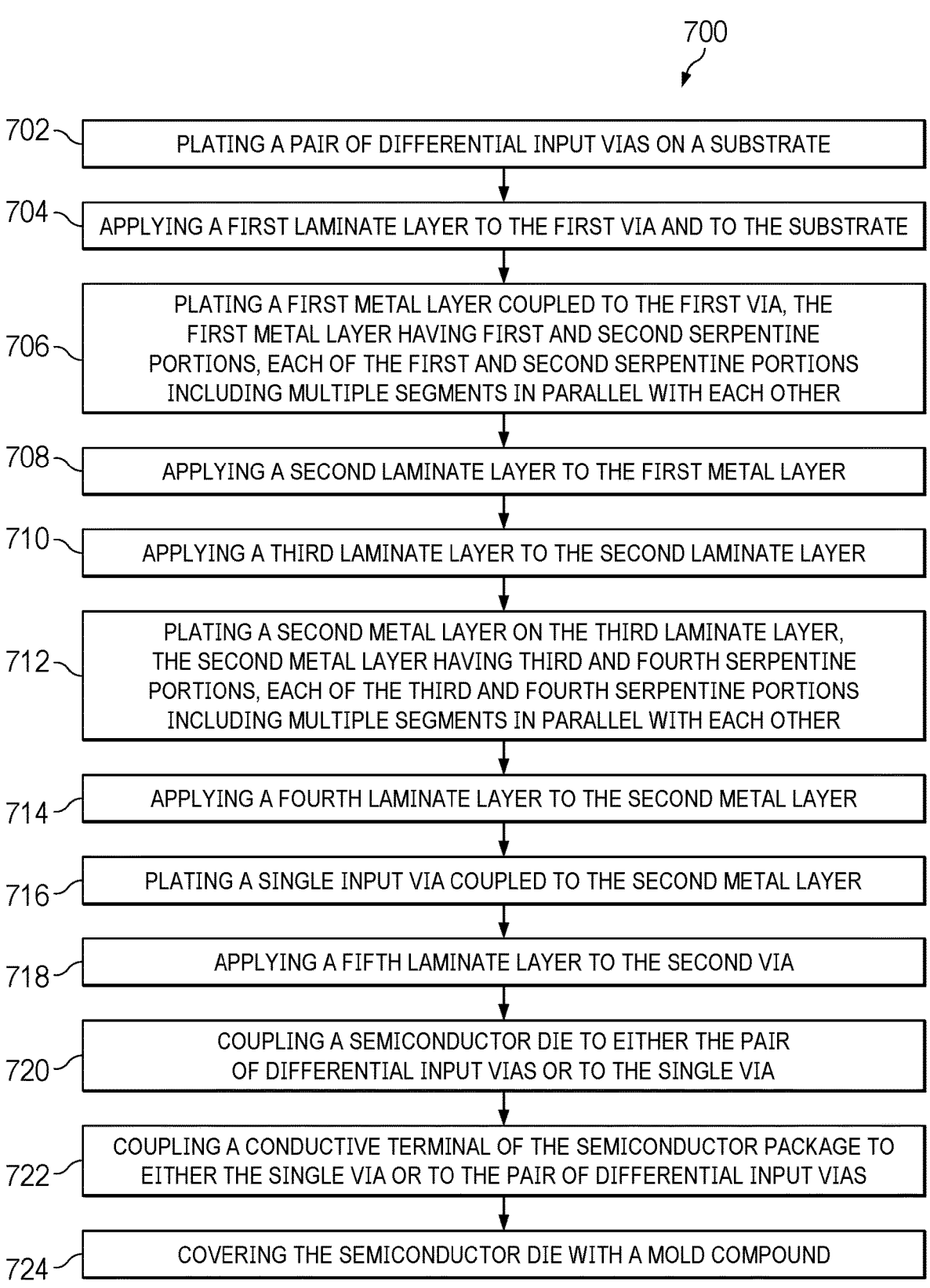

702 — PLATING A PAIR OF DIFFERENTIAL INPUT VIAS ON A SUBSTRATE

704 — APPLYING A FIRST LAMINATE LAYER TO THE FIRST VIA AND TO THE SUBSTRATE

706 — PLATING A FIRST METAL LAYER COUPLED TO THE FIRST VIA, THE FIRST METAL LAYER HAVING FIRST AND SECOND SERPENTINE PORTIONS, EACH OF THE FIRST AND SECOND SERPENTINE PORTIONS INCLUDING MULTIPLE SEGMENTS IN PARALLEL WITH EACH OTHER

708 — APPLYING A SECOND LAMINATE LAYER TO THE FIRST METAL LAYER

710 — APPLYING A THIRD LAMINATE LAYER TO THE SECOND LAMINATE LAYER

712 — PLATING A SECOND METAL LAYER ON THE THIRD LAMINATE LAYER, THE SECOND METAL LAYER HAVING THIRD AND FOURTH SERPENTINE PORTIONS, EACH OF THE THIRD AND FOURTH SERPENTINE PORTIONS INCLUDING MULTIPLE SEGMENTS IN PARALLEL WITH EACH OTHER

714 — APPLYING A FOURTH LAMINATE LAYER TO THE SECOND METAL LAYER

716 — PLATING A SINGLE INPUT VIA COUPLED TO THE SECOND METAL LAYER

718 — APPLYING A FIFTH LAMINATE LAYER TO THE SECOND VIA

720 — COUPLING A SEMICONDUCTOR DIE TO EITHER THE PAIR OF DIFFERENTIAL INPUT VIAS OR TO THE SINGLE VIA

722 — COUPLING A CONDUCTIVE TERMINAL OF THE SEMICONDUCTOR PACKAGE TO EITHER THE SINGLE VIA OR TO THE PAIR OF DIFFERENTIAL INPUT VIAS

724 — COVERING THE SEMICONDUCTOR DIE WITH A MOLD COMPOUND

MARCHAND BALUNS IN CORELESS PACKAGE SUBSTRATES

CROSS-REFERENCE TO RELATED APPLICATIONS

The present application claims priority to U.S. Provisional Patent Application No. 63/401,904, which was filed Aug. 29, 2022, is titled "Wideband Marchand Balun In Coreless Substrate For High Speed and High Frequency Applications," and is hereby incorporated herein by reference in its entirety.

BACKGROUND

A balun is a type of transformer that is used to match the impedance of an unbalanced signal, such as a coaxial cable, to the impedance of a balanced signal, such as a twisted pair of wires. Marchand baluns, commonly used in antennas, amplifiers, and mixers, are a type of balun used in radio frequency (RF) circuits to convert between unbalanced and balanced signals. A Marchand balun uses a transmission line to create a phase shift between the input and output signals, which allows for the conversion from unbalanced to balanced signals. The transmission lines are quarter-wavelength or half-wavelength long, depending on the frequency of the signal being transmitted. The Marchand balun can also be used in reverse to convert from balanced to unbalanced signals. The Marchand balun provides good isolation between the input and output signals, which reduces interference and signal loss. Additionally, it can operate over a wide frequency range and can handle high power levels.

SUMMARY

In examples, a semiconductor package comprises a conductive terminal; a semiconductor die including a device side having circuitry formed therein, the device side facing toward the conductive terminal; and a substrate coupled to the conductive terminal and to the device side of the semiconductor die. The substrate includes a first metal layer coupled to first and second vias extending toward and coupled to either the device side of the semiconductor die or the conductive terminal. The substrate includes a second metal layer electrically isolated from the first metal layer by an insulation layer between the first and second metal layers, the second metal layer coupled to a third via extending toward and coupled to either the conductive terminal or the semiconductor die. The first and second metal layers form a Marchand balun.

In examples, a method for manufacturing a semiconductor package comprises plating a pair of differential input vias on a substrate; applying a first laminate layer to the pair of differential input vias and to the substrate; plating a first metal layer coupled to the pair of differential input vias, the first metal layer having first and second serpentine portions, each of the first and second serpentine portions including multiple segments in parallel with each other; applying a second laminate layer to the first metal layer; applying a third laminate layer to the second laminate layer; plating a second metal layer on the third laminate layer, the second metal layer having third and fourth serpentine portions, each of the third and fourth serpentine portions including multiple segments in parallel with each other; applying a fourth laminate layer to the second metal layer; plating a single input via coupled to the second metal layer; applying a fifth laminate layer to the single input via; coupling a semiconductor die to either the pair of differential input vias or to the single via; coupling a conductive terminal of the semiconductor package to either the single input via or to the pair of differential input vias; and covering the semiconductor die with a mold compound.

BRIEF DESCRIPTION OF THE DRAWINGS

Some of the drawings provided herein show cross-sectional or profile views that depict more or fewer elements than may be expected in a cross-sectional or profile view drawing. Such drawings are provided to facilitate clarity and views of elements irrespective of position within the structure being shown.

FIG. 4A1 is a perspective view of a semiconductor package including a coreless substrate in which multiple metal layers are configured to form a Marchand balun, in accordance with various examples.

FIG. 4A2 is a perspective view of a portion of a semiconductor package including a coreless substrate in which multiple metal layers are configured to form a Marchand balun, in accordance with various examples.

FIG. 4A3 is a perspective view of a portion of a semiconductor package including a coreless substrate in which multiple metal layers are configured to form a Marchand balun, in accordance with various examples.

FIG. 6 is a flow diagram of a method for manufacturing a semiconductor package including a coreless substrate having a Marchand balun formed therein, in accordance with various examples.

FIG. 7 is a flow diagram of a method for manufacturing a semiconductor package including a coreless substrate having a Marchand balun formed therein, in accordance with various examples.

DETAILED DESCRIPTION

Figure 1:
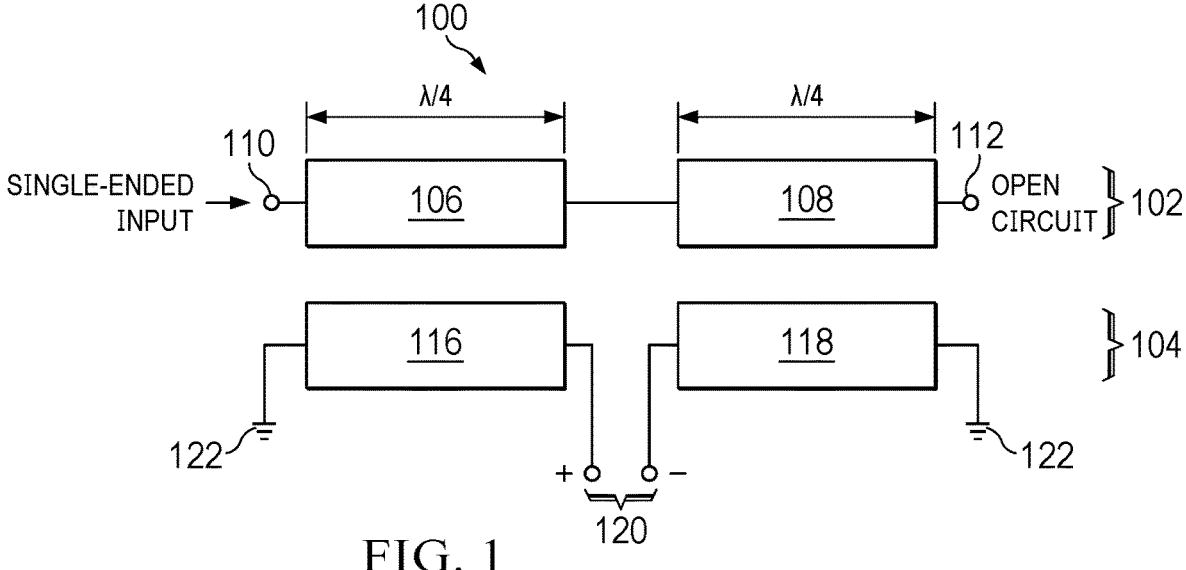
FIG. 1 is a circuit schematic diagram of a Marchand balun, in accordance with various examples.

Although Marchand baluns provide various benefits, the design and implementation of a Marchand balun can be complex, and it requires careful attention to the physical dimensions and electrical properties of the transmission line. In addition, although baluns are passive devices, they tend to occupy large amounts of space on the circuitry-containing, active (i.e., device) surfaces of semiconductor dies, which is a highly inefficient use of valuable active surface space. Space-conserving efforts to relocate baluns from dies to other areas within the semiconductor package, such as cored substrates coupled to the dies, have produced mixed results, as such cored substrates tend to be expensive and have prohibitively challenging design rules.

This disclosure describes various examples of a semiconductor package comprising a Marchand balun in a coreless package substrate (e.g., embedded trace substrate (ETS)). In examples, a semiconductor package comprises a conductive terminal and a semiconductor die including a device side having circuitry formed therein. The device side faces toward the conductive terminal. The package also comprises a substrate coupled to the conductive terminal and to the device side of the semiconductor die. The substrate includes a first metal layer coupled to first and second vias extending toward and coupled to either the device side of the semiconductor die or the conductive terminal. The substrate also includes a second metal layer electrically isolated from the first metal layer by an insulation layer between the first and second metal layers. The second metal layer is coupled to a third via extending toward and coupled to either the conductive terminal or the semiconductor die. The first and second metal layers form a Marchand balun. By positioning the Marchand balun in a coreless substrate using the unique balun structures described herein, the technical challenges described above—namely, inefficiencies in package space usage and design rule challenges associated with cored substrates—are mitigated. The examples described herein also provide numerous other advantages over prior solutions. For example, because coreless substrates are less expensive than cored substrates, and because the examples described herein occupy less space than the space occupied in cored substrates (e.g., three substrate layers as opposed to six or more substrate layers in cored substrates), costs are mitigated. In addition, due to the more permissive design rules of coreless substrates (e.g., coreless embedded trace substrate (ETS)), the horizontal area occupied by the metal layers in the coreless substrate is reduced relative to the horizontal area occupied by metal layers in cored substrates, thereby reducing costs. In the examples described herein, experimental data show that wider bandwidths (e.g., 9 GHz) are achieved relative to those achieved in cored substrates (e.g., 5.35 GHz). Further still, amplitude and phase imbalances and common mode rejection ratio (CMRR) performance is superior to that in cored substrates and a center tap connecting one of the metal layers in the coreless substrate to ground can be tuned to mitigate such imbalances and CMRR inadequacies.

FIG. 1 is a circuit schematic diagram of a Marchand balun, in accordance with various examples. Specifically, FIG. 1 shows a Marchand balun 100 including a metal layer 102 and a metal layer 104. The metal layer 102 includes a serpentine portion 106 and a serpentine portion 108 coupled to the serpentine portion 106. For example, each of the serpentine portions 106, 108 may include metal segments arranged in a serpentine configuration, e.g., parallel and/or perpendicular to each other, as described below. The metal layer 102 includes a single-ended input/output (I/O) 110 and an open circuit end 112. The metal layer 104 includes a serpentine portion 116 and a serpentine portion 118. Each of the serpentine portions 116, 118 may include metal segments arranged in a serpentine configuration, e.g., parallel and/or perpendicular to each other, as described below. The metal layer 104 includes a differential I/O 120, one terminal of which extends from the serpentine portion 116, and the other terminal of which extends from the serpentine portion 118. Each of the serpentine portions 116, 118 couples to a ground terminal 122. In an example operation, an input signal provided at single-ended I/O 110 is converted into a differential signal, with a phase difference of 180 degrees, at differential I/O 120. Similarly, an input signal provided at differential I/O 120 may be converted to a single output signal at single-ended I/O 110.

Figure 2A:
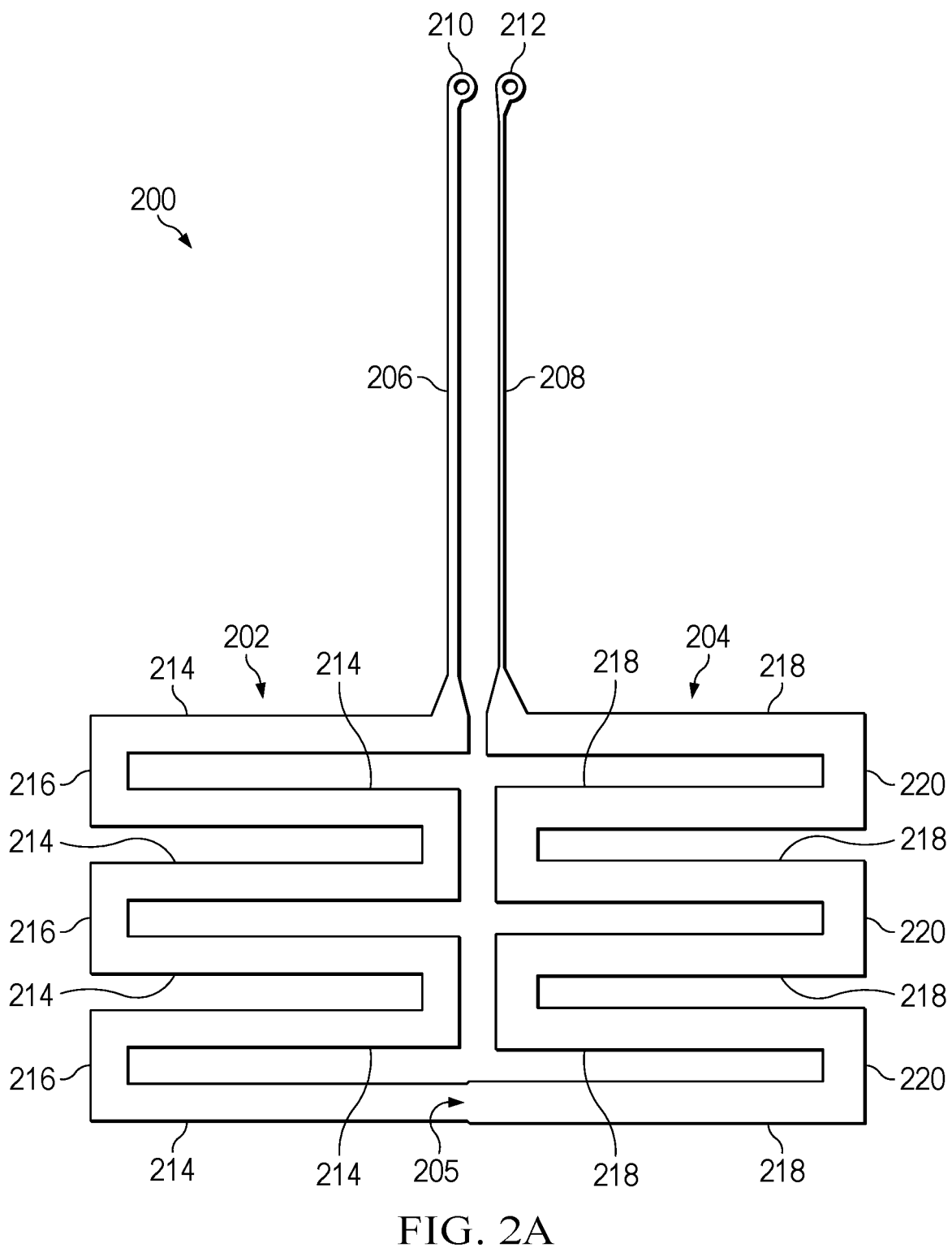
FIG. 2A is a top-down view of a metal layer of a Marchand balun, in accordance with various examples.

FIG. 2A is a top-down view of a metal layer 200 of a Marchand balun, in accordance with various examples. The metal layer 200 may be implemented, for example, in a semiconductor package coreless substrate to achieve the technical benefits described above. The metal layer 200 may include any suitable type of metal, such as copper, aluminum, gold, etc. The metal layer 200 includes a serpentine portion 202 and a serpentine portion 204. The serpentine portion 202 is coupled to an elongate member 206 of the metal layer 200. Similarly, the serpentine portion 204 is coupled to an elongate member 208 of the metal layer 200. The elongate member 206 terminates at an I/O terminal 210, and the elongate member 208 terminates at an I/O terminal

5

212. Together, the I/O terminals 210, 212 form a differential I/O, such as the differential I/O 120 described above.

The serpentine portion 202 includes multiple metal segments 214 that are parallel, or at least approximately parallel, to each other. The serpentine portion 202 includes multiple metal segments 216 that are parallel, coaxial, or at least approximately parallel or coaxial, to each other. Each metal segment 214 extends orthogonally relative to each metal segment 216.

A total length of the serpentine portion 202 is approximately one-quarter of the wavelength of the signal being radiated, with this length determining the frequency of operation of the balun.

The serpentine portion 204 includes multiple metal segments 218 that are parallel, or at least approximately parallel, to each other. The serpentine portion 204 includes multiple metal segments 220 that are parallel, or at least approximately parallel, to each other. Each metal segment 218 extends orthogonally relative to each metal segment 220. The metal segments of the serpentine portion 204 are wider than the metal segments of the serpentine portion 202, forming a width gradient where the respective ends of the serpentine portions 202, 204 meet at area 205.

Figures 2B, 2C:
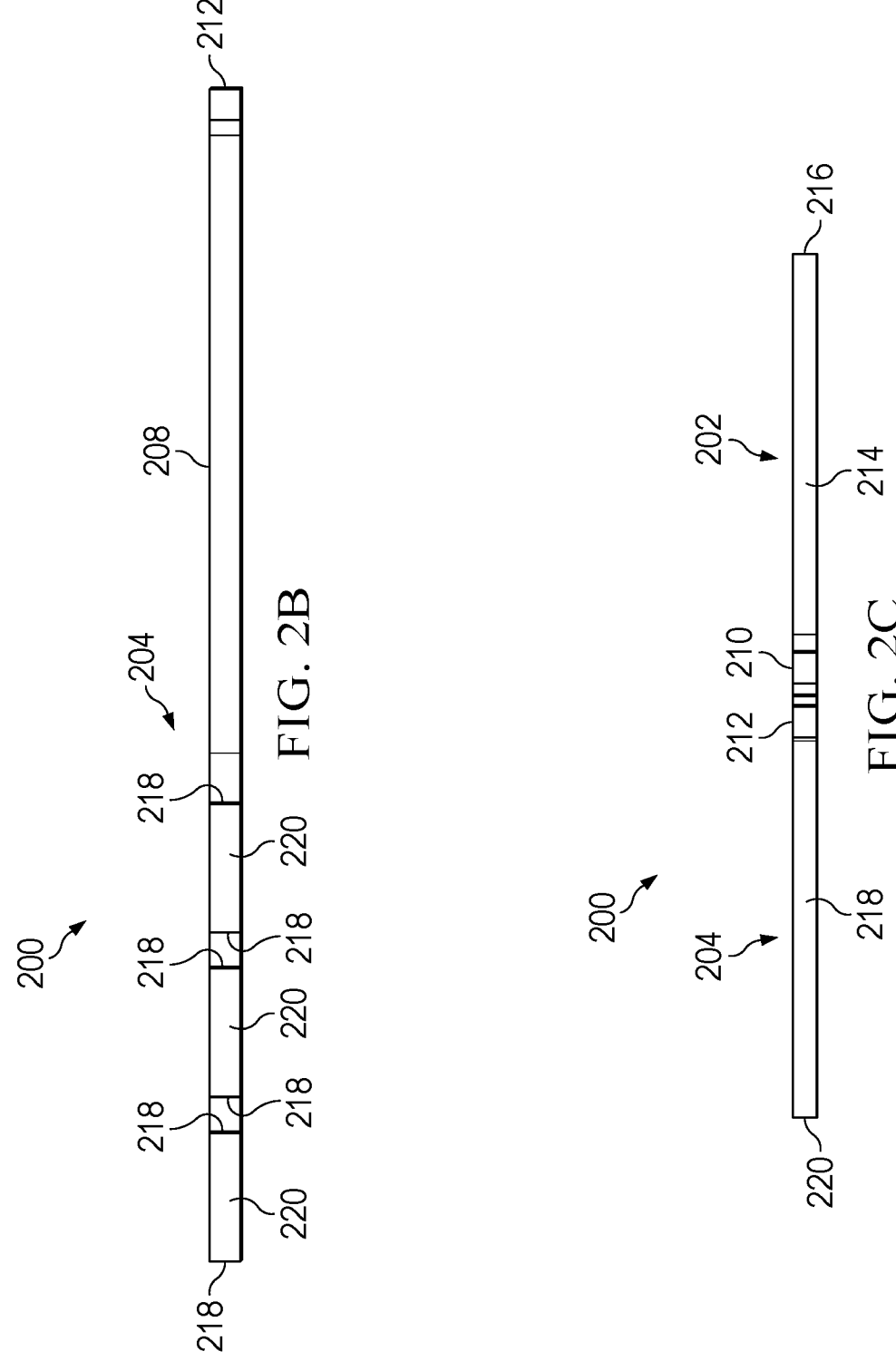
FIG. 2B is a profile view of a metal layer of a Marchand balun, in accordance with various examples.
FIG. 2C is a profile view of a metal layer of a Marchand balun, in accordance with various examples.
Figure 2D:
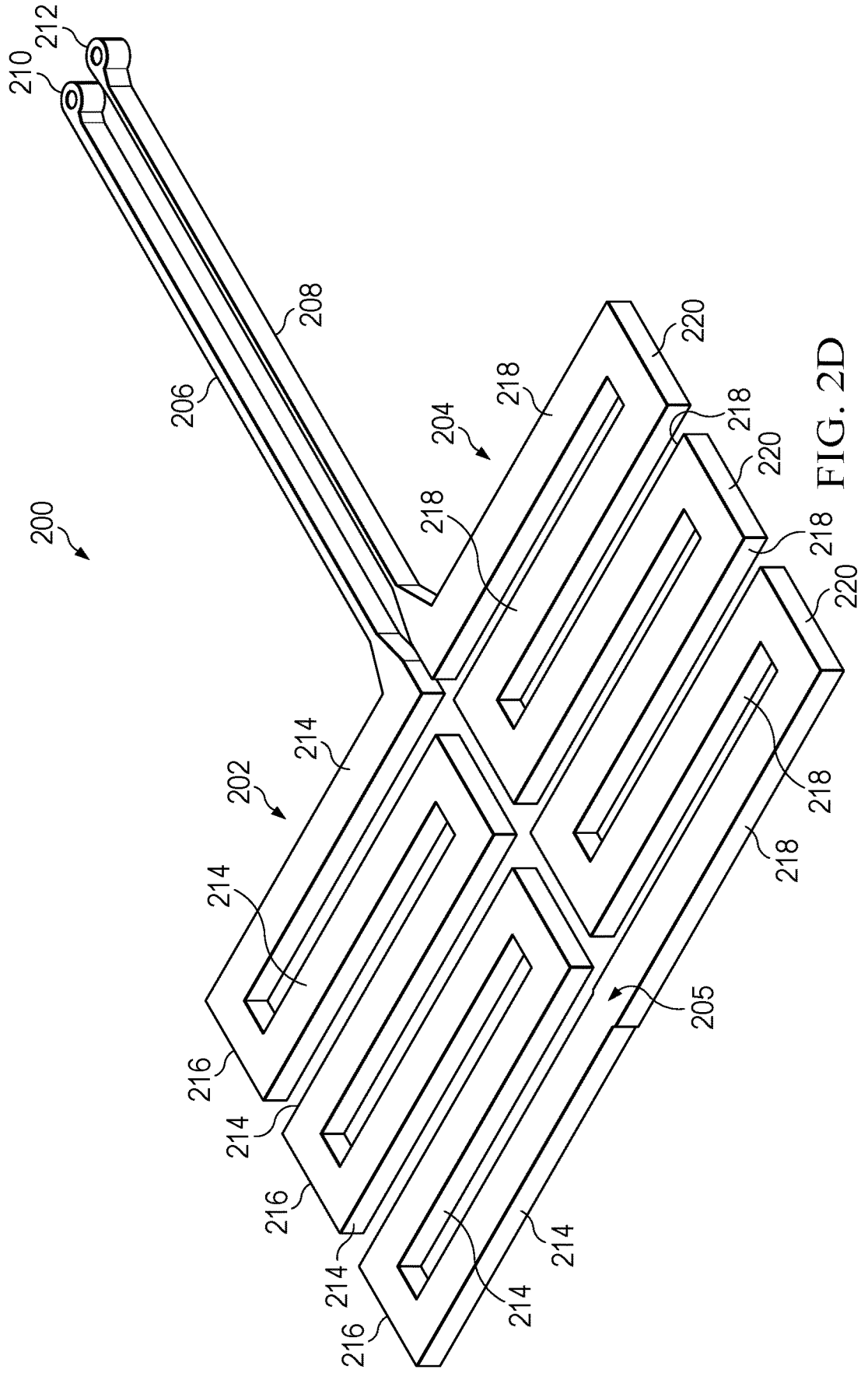
FIG. 2D is a perspective view of a metal layer of a Marchand balun, in accordance with various examples.

FIG. 2B is a profile view of the metal layer 200, in accordance with various examples. FIG. 2C is a profile view of the metal layer 200, in accordance with various examples. FIG. 2D is a perspective view of the metal layer 200, in accordance with various examples.

Figure 3A:
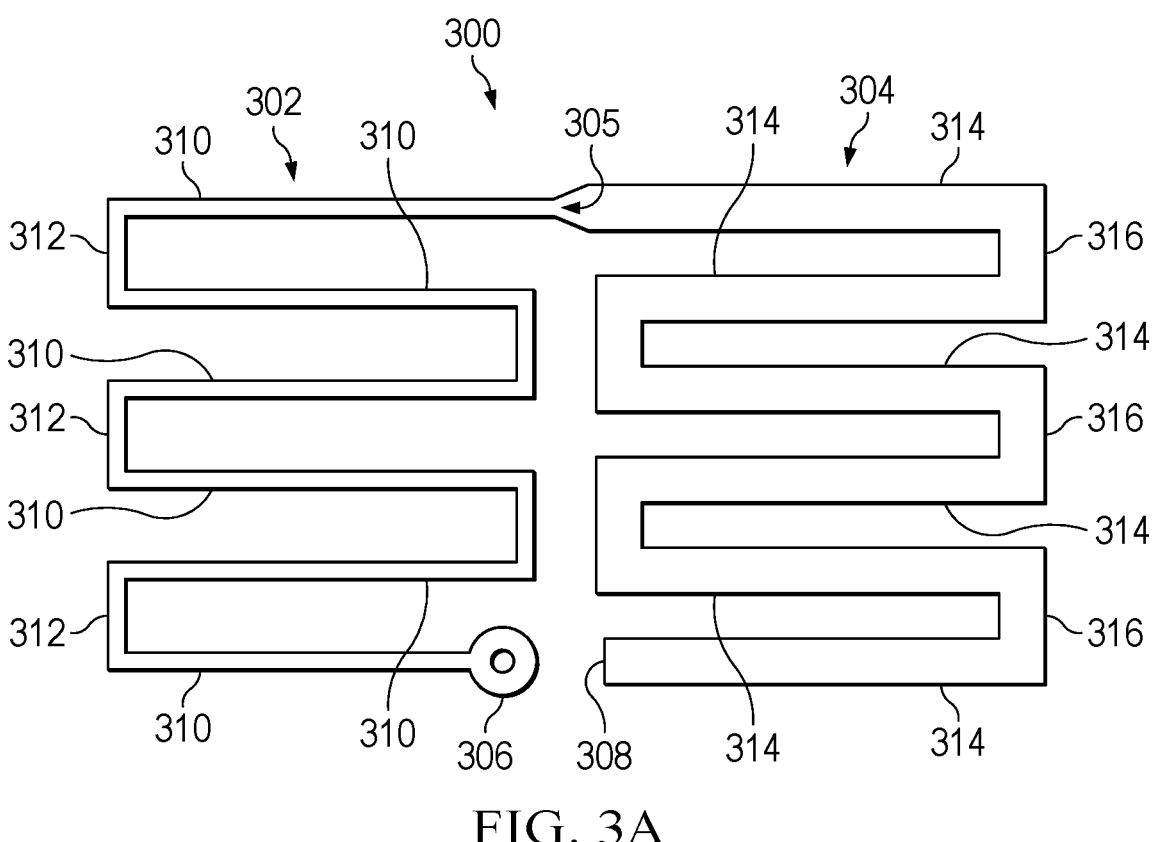
FIG. 3A is a top-down view of a metal layer of a Marchand balun, in accordance with various examples.

FIG. 3A is a top-down view of a metal layer 300 of a Marchand balun, in accordance with various examples. The metal layer 300 may be implemented, for example, in a semiconductor package coreless substrate to achieve the technical benefits described above. The metal layer 300 may include any suitable type of metal, such as copper, aluminum, gold, etc. The metal layer 300 includes a serpentine portion 302 and a serpentine portion 304. In examples, the serpentine portion 302 terminates at a single-ended I/O terminal 306, and the serpentine portion 304 terminates at open circuit end 308.

The serpentine portion 302 includes multiple metal segments 310 that are parallel, or at least approximately parallel, to each other. The serpentine portion 302 includes multiple metal segments 312 that are parallel, coaxial, or at least approximately parallel or coaxial, to each other. Each metal segment 310 extends orthogonally relative to each metal segment 312.

A total length of the serpentine portion 302 is approximately one-half of the wavelength of the signal being radiated, with this length determining the frequency of operation of the balun. The number of turns (i.e., right angles) in the serpentine portion 302 ranges between 9-11 turns, with a number of turns outside this range being disadvantageous because it significantly changes occupied space in the semiconductor package and/or diminishes coupling with the other metal layer of the Marchand balun (e.g., the metal layer 200).

The serpentine portion 304 includes multiple metal segments 314 that are parallel, or at least approximately parallel, to each other. The serpentine portion 304 includes multiple metal segments 316 that are parallel, coaxial, or at least approximately parallel or coaxial, to each other. Each metal segment 314 extends orthogonally relative to each metal segment 316. The ratio of the width of the metal segments in the serpentine portion 202 to the width of the metal segments in the serpentine portion 204 is greater than the ratio of the width of the metal segments in the serpentine portion 302 to the width of the metal segments in the serpentine portion 304. A width gradient exists at area 305, which represents a meeting of the respective ends of the serpentine portions 302, 304.

A total length of the serpentine portion 304 is approximately one-half of the wavelength of the signal being radiated, with this length determining the frequency of operation of the balun.

Figure 3B:
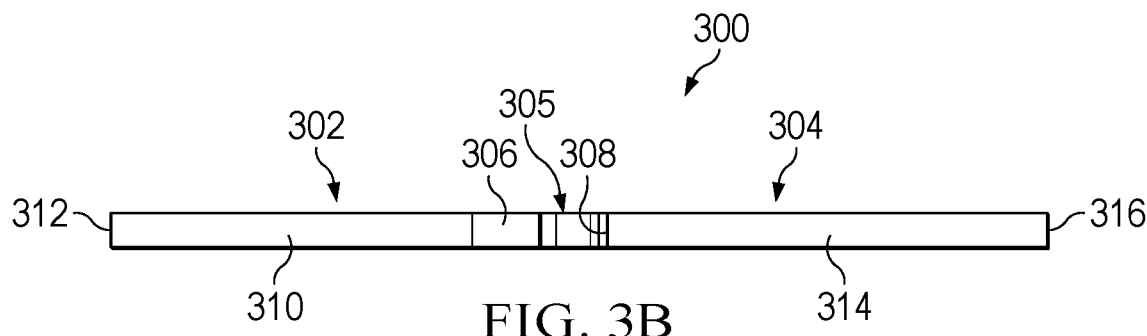
FIG. 3B is a profile view of a metal layer of a Marchand balun, in accordance with various examples.
Figure 3C:
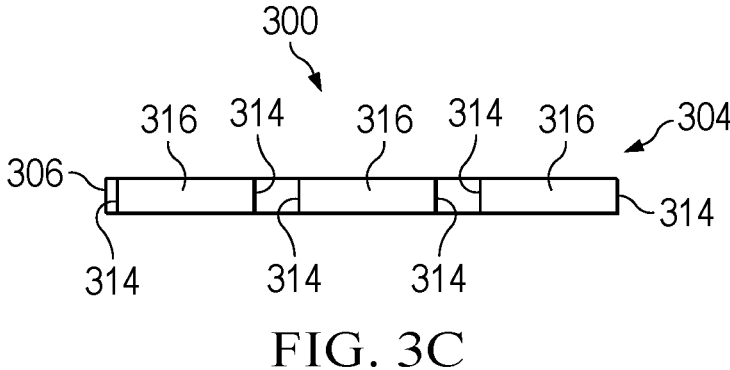
FIG. 3C is a profile view of a metal layer of a Marchand balun, in accordance with various examples.
Figure 3D:
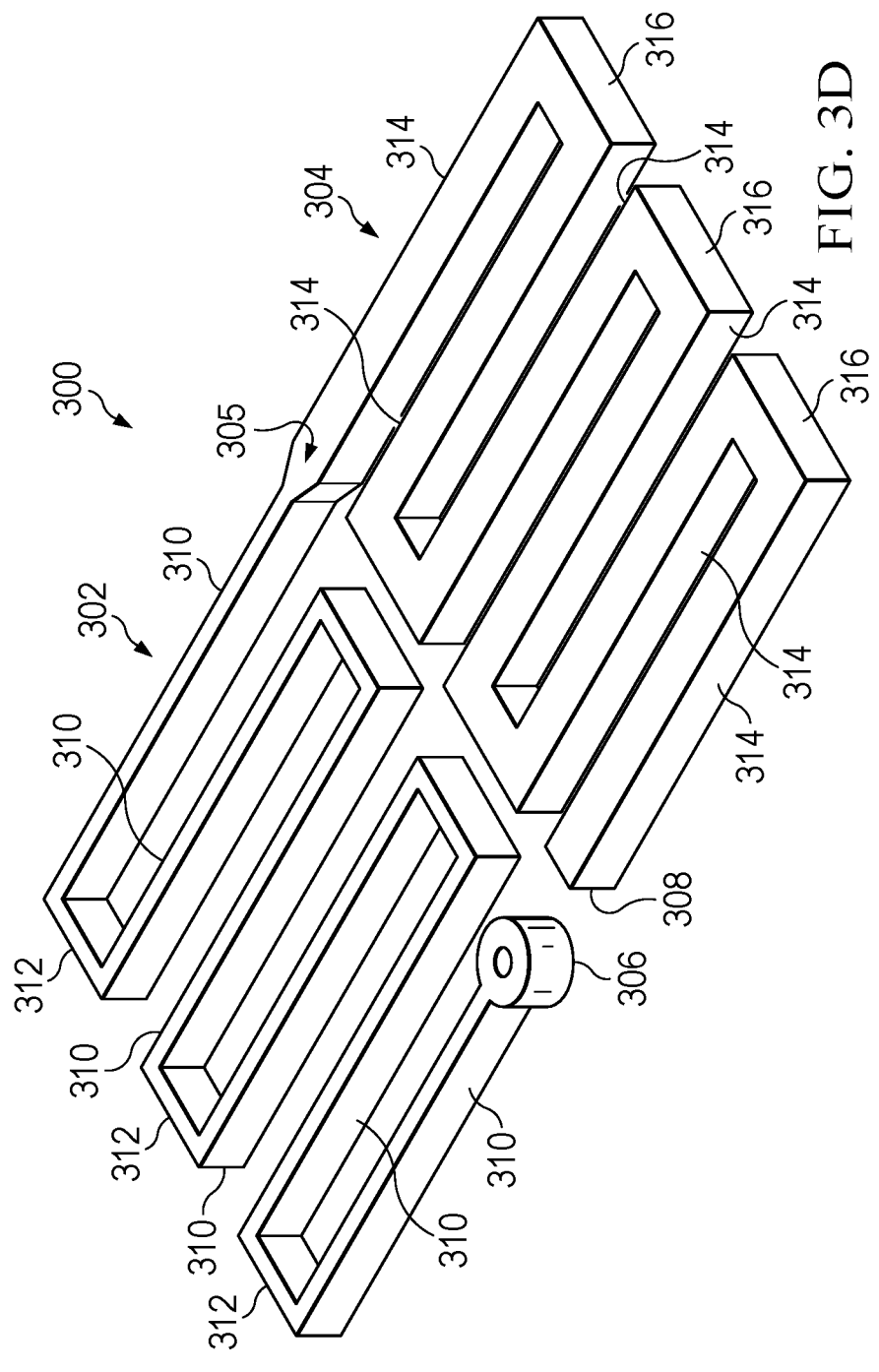
FIG. 3D is a perspective view of a metal layer of a Marchand balun, in accordance with various examples.

The I/O terminal 306 includes a loop. The loop may be sufficiently large to accommodate a via that can extend therethrough to provide current between the metal layer 300 and another component, such as a conductive terminal (e.g., lead, solder ball) of a package in which the metal layers 200, 300 are contained. FIG. 3B is a profile view of the metal layer 300, in accordance with various examples. FIG. 3C is a profile view of the metal layer 300, in accordance with various examples. FIG. 3D is a perspective view of the metal layer 300, in accordance with various examples.

FIG. 4A1 is a perspective view of a semiconductor package 400 including a coreless substrate 402 (e.g., a substrate composed of a suitable laminate) in which multiple metal layers are configured to form a Marchand balun, in accordance with various examples. Specifically, FIG. 4A1 shows a multi-layer coreless substrate 402 containing the metal layers 200 and 300. The metal layers 200 and 300 are not in physical contact with each other, nor is there a direct, physical connection between the two metal layers 200 and 300 conducive to carrying electricity. Instead, the metal layers 200 and 300 are coupled electromagnetically. The metal layers 200 and 300 may be separated by a layer of the coreless substrate 402. Although the metal layer 200 is clearly visible in FIG. 4A1, the view of metal layer 300 is obscured or partially obscured by the metal layer 200.

As shown in one of the insets of FIG. 4A1 (i.e., FIG. 4A2), vias 404, 406 extend through the loops of the I/O terminals 210, 212, respectively. The vias 404, 406 provide electrical connections between the I/O terminals 210, 212 and the component(s) to which they connect, such as a semiconductor die (not shown in FIG. 4A2 for clarity). In examples, the semiconductor die is positioned above the metal layer 200 so that the die may couple to the vias 404, 406. As shown in the other inset of FIG. 4A1 (i.e., FIG. 4A3), a via 408 extends through the I/O terminal 306. The via 408 extends downward, away from the metal layer 300 and toward the bottom of the package 400. A center tap 410 is a metal member that couples the metal layer 200 to a ground node, such as a specific conductive terminal or solder ball of the package 400 that is coupled to ground. A mold compound 414 covers the various components of the package 400, such as the coreless substrate 402 and the metal layers 200 and 300.

Figure 4B:
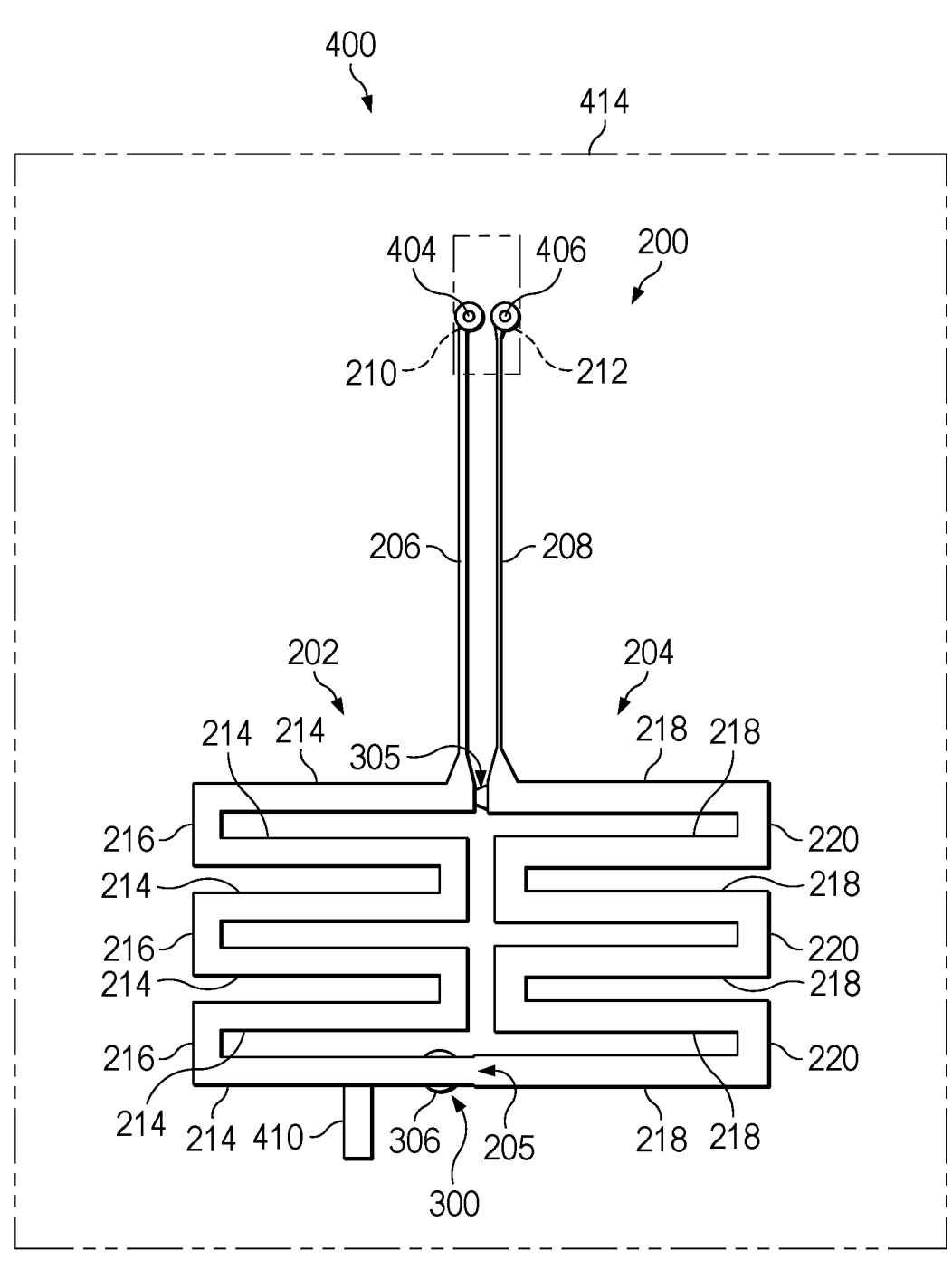
FIG. 4B is a top-down view of a semiconductor package including a coreless substrate in which multiple metal layers are configured to form a Marchand balun, in accordance with various examples.
Figure 4C:
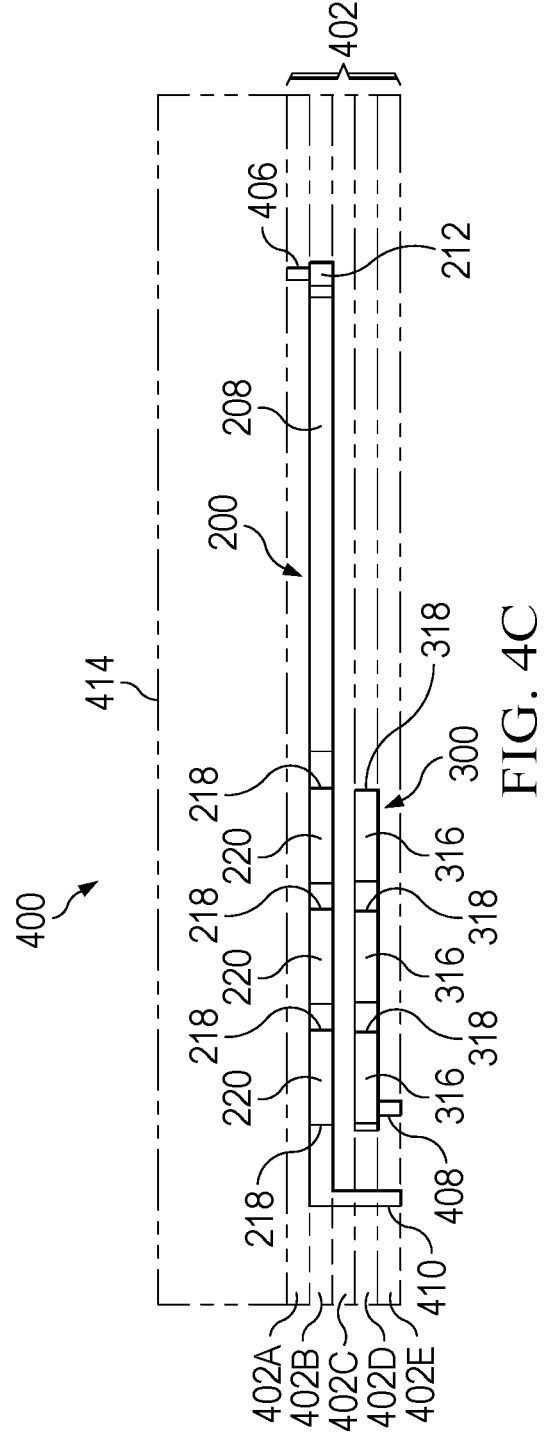
FIG. 4C is a profile view of a semiconductor package including a coreless substrate in which multiple metal layers are configured to form a Marchand balun, in accordance with various examples.
Figure 4D:
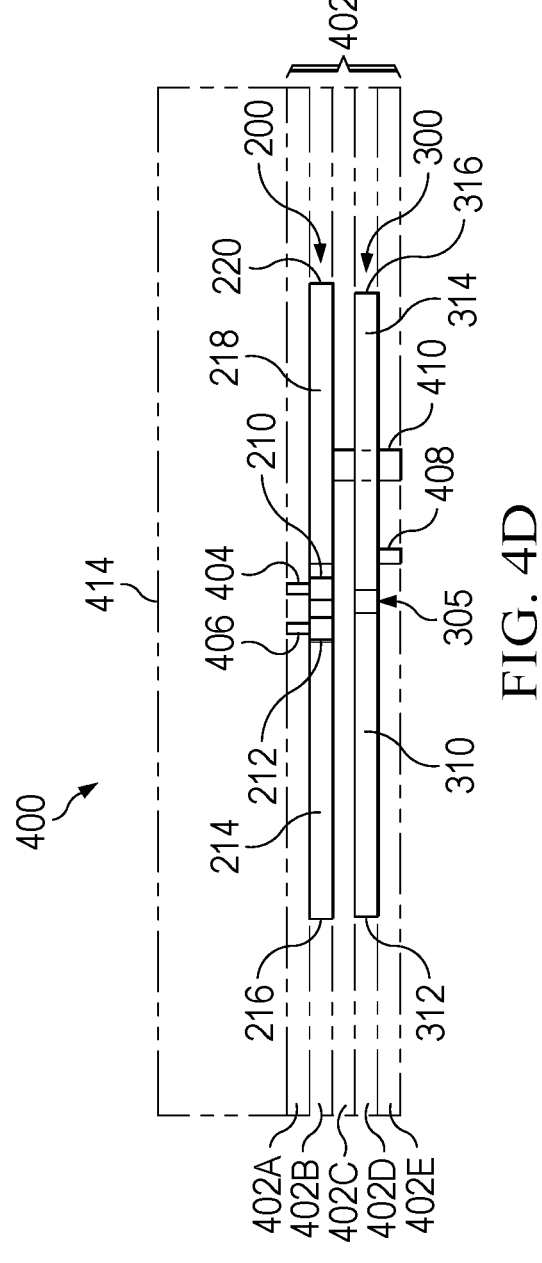
FIG. 4D is a profile view of a semiconductor package including a coreless substrate in which multiple metal layers are configured to form a Marchand balun, in accordance with various examples.

The metal layers 200 and 300 are in vertical alignment with each other. For example, the serpentine portions 202, 302 may have the same number of turns and their respective metal segments may have the same lengths, and thus may be capable of being in vertical alignment with each other (i.e., each of the metal segments 214 is vertically aligned with a corresponding metal segment 310 below it, and each of the metal segments 216 is vertically aligned with a corresponding metal segment 312 below it). Similarly, the serpentine portions 204, 304 may have the same number of turns and their respective metal segments may have the same lengths, and thus may be capable of being in vertical alignment with each other (i.e., each of the metal segments 214 is vertically aligned with a corresponding metal segment 314 below it). FIG. 4B is a top-down view of the semiconductor package 400, in accordance with various examples. FIG. 4C is a profile view of the semiconductor package 400, in accordance with various examples. FIG. 4D is a profile view of the semiconductor package 400, in accordance with various examples.

Figure 5A:
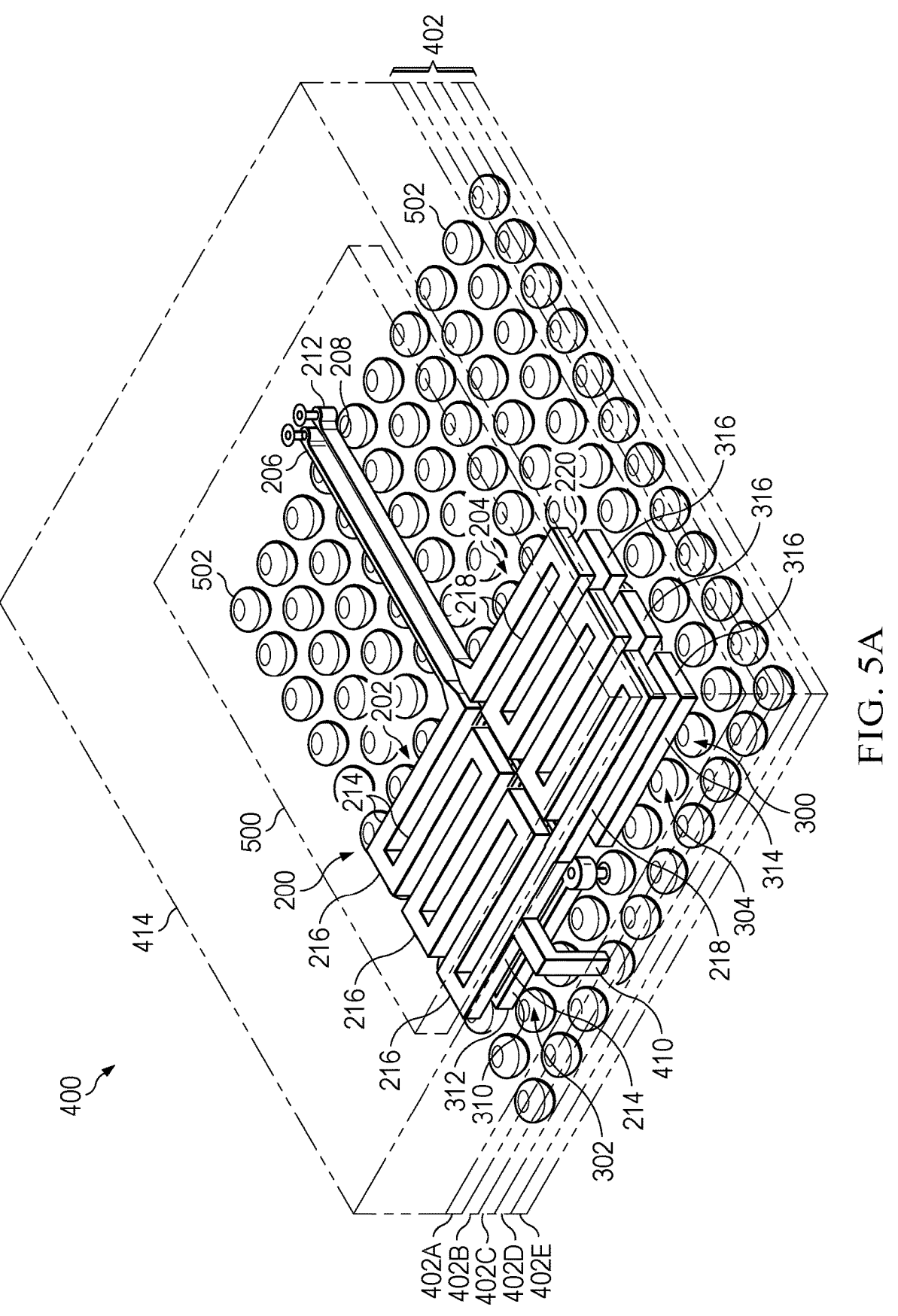
FIG. 5A is a perspective view of a semiconductor package including a coreless substrate in which multiple metal layers are configured to form a Marchand balun, in accordance with various examples.
Figure 5B:
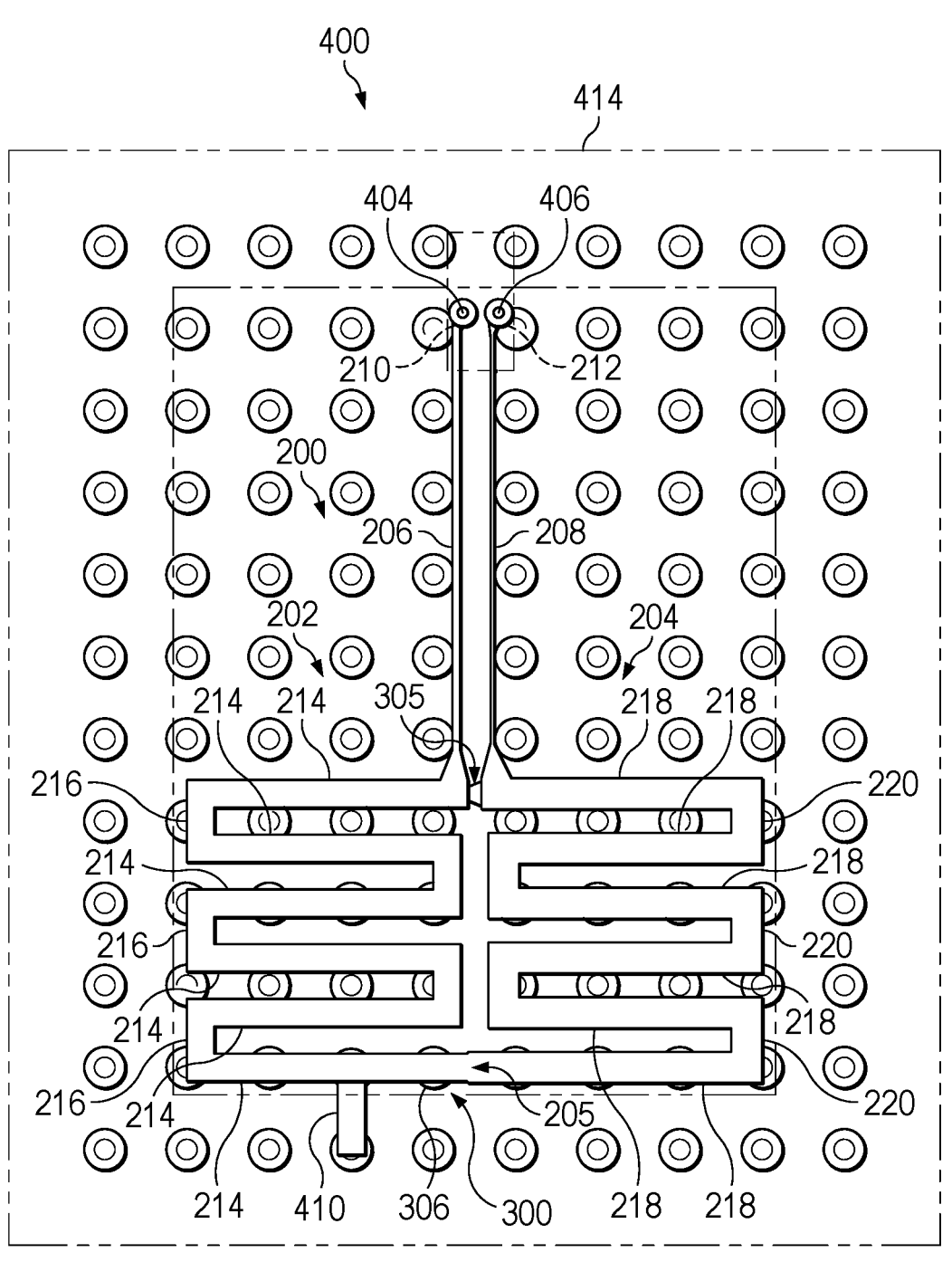
FIG. 5B is a top-down view of a semiconductor package including a coreless substrate in which multiple metal layers are configured to form a Marchand balun, in accordance with various examples.
Figure 5C:
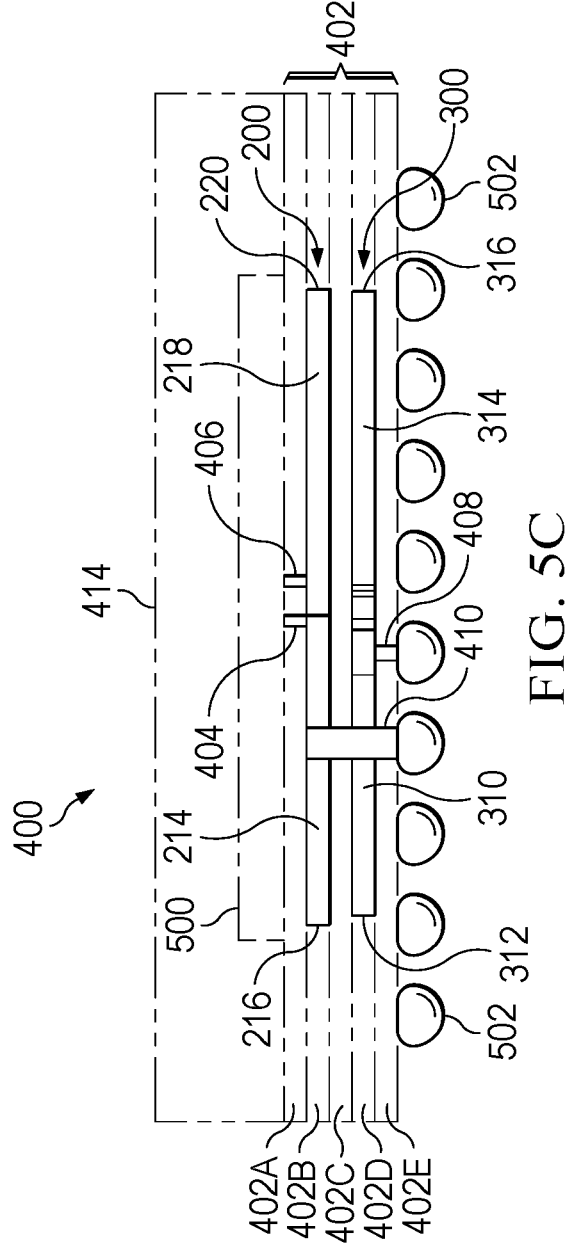
FIG. 5C is a profile view of a semiconductor package including a coreless substrate in which multiple metal layers are configured to form a Marchand balun, in accordance with various examples.

FIGS. 5A-5D depict the semiconductor package 400 of FIGS. 4A1-4D, but with additional detail, such as a semiconductor die and conductive terminals. More specifically, FIG. 5A is a perspective view of the semiconductor package 400, in accordance with various examples. FIG. 5A shows the same structure as FIG. 4A1, but with the addition of a semiconductor die 500 above the substrate 402 and conductive terminals 502 coupled to a bottom surface of the package 400. The semiconductor die 500 includes terminals that couple to the vias 404, 406, and at least one of the conductive terminals 502 couples to the via 408, while at least one of the conductive terminals 502 couples to the center tap 410. The semiconductor die 500 may include circuitry on a bottom side (i.e., a device side facing the metal layers 200, 300), and this circuitry may be configured to perform any suitable function or operation, such as functions and operations that may benefit from a Marchand balun. FIG. 5B is a top-down view of the package 400 as depicted in FIG. 5A, in accordance with various examples. FIG. 5C is a profile view of the package 400 as depicted in FIG. 5A, in accordance with various examples. As shown, the substrate 402 includes insulative (e.g., laminate) layers 402A-402E. Layer 402B includes the metal layer 200, and layer 402D includes the metal layer 300. Layer 402C electrically isolates the metal layers 200 and 300 from each other. The vias 404, 406 extend from the metal layer 200, through the layer 402A, and to the device side of the semiconductor die 500. The via 408 extends from the metal layer 300, through the layer 402E, and to a conductive terminal 502, such as a solder ball. The center tap 410 extends from the metal layer 200, through the layers 402C-402E, and to a conductive terminal 502. As the center tap 410 extends through layer 402D, the center tap 410 does not contact the metal layer 300. As shown, the metal layers 200, 300 are vertically aligned with each other.

Figure 5D:
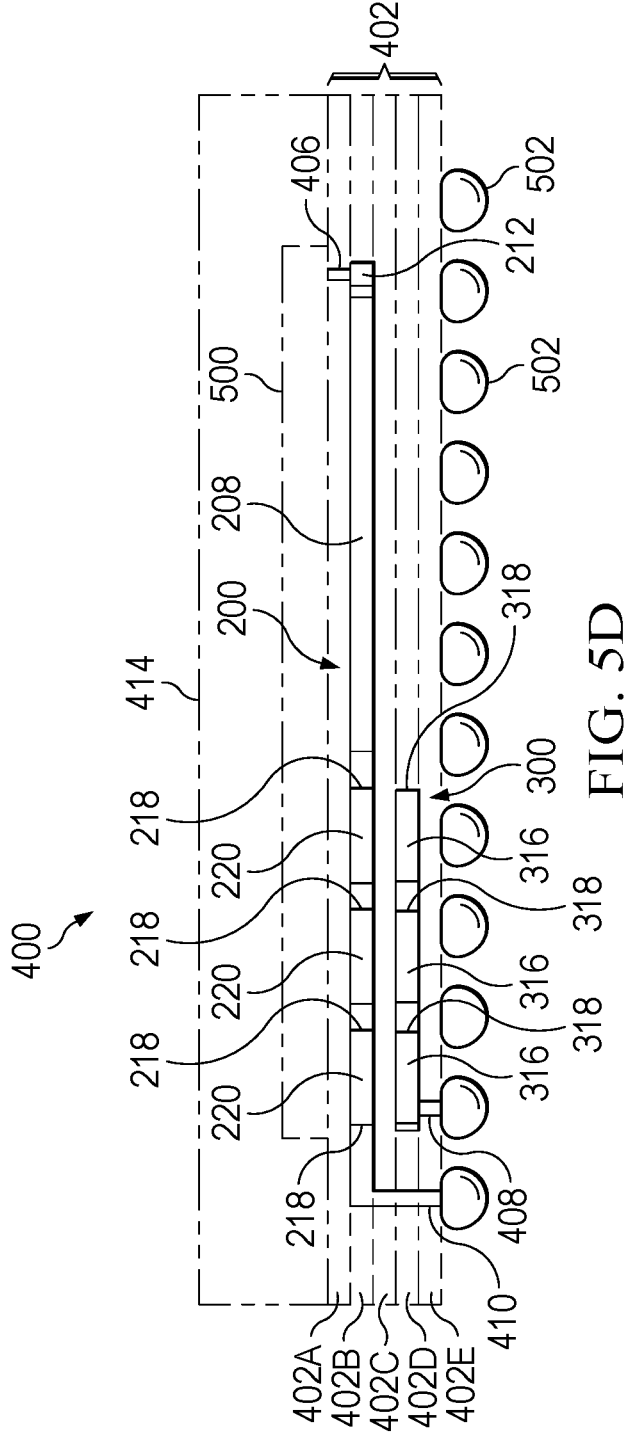
FIG. 5D is a profile view of a semiconductor package including a coreless substrate in which multiple metal layers are configured to form a Marchand balun, in accordance with various examples.

FIG. 5D is a profile view of the package 400 as depicted in FIG. 5A, in accordance with various examples. The via 406 extends from the metal layer 200 to the device side of the semiconductor die 500. Although not expressly shown in FIGS. 5C and 5D, the via 406 extends through a corresponding loop of the I/O terminal 212, as FIG. 4A2 shows. Via 404 is not visible in the view of FIG. 5D. The center tap 410 extends to couple to a conductive terminal 502, as shown, and the via 408 also extends to couple to a conductive terminal 502, as shown.

FIG. 6 is a flow diagram of a method 600 for manufacturing a semiconductor package (e.g., package 400) including a coreless substrate having a Marchand balun formed therein, in accordance with various examples. The method 600 begins with forming a substrate (e.g., substrate 402) comprising a first metal layer (e.g., metal layer 200) having a first serpentine portion (e.g., serpentine portion 202) with multiple segments in parallel with each other and a second serpentine portion (e.g., serpentine portion 204) with multiple segments in parallel with each other. The substrate also comprises a second metal layer (e.g., metal layer 300) having a third serpentine portion (e.g., serpentine portion 302) with multiple segments in parallel with each other and a fourth serpentine portion (e.g., serpentine portion 304) with multiple segments in parallel with each other. The substrate also comprises multiple insulation layers (e.g., layers 402A-402E) (602). The method 600 further includes coupling circuitry on a device side of a semiconductor die (e.g., die 500) to first and second vias (e.g., vias 404, 406)

(604). The method 600 includes coupling a third via (e.g., via 408) to a conductive terminal (e.g., conductive terminal 502) (606). The method 600 includes covering the semiconductor die and the substrate with a mold compound (e.g., mold compound 414) (608).

Figure 8A:
FIGS. 8A-8W are a process flow of a method for manufacturing a semiconductor package including a coreless substrate having a Marchand balun formed therein, in accordance with various examples.
Figure 8B:
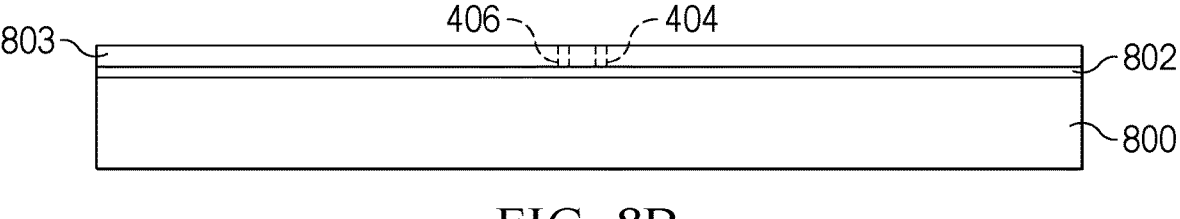
Figure 8C:
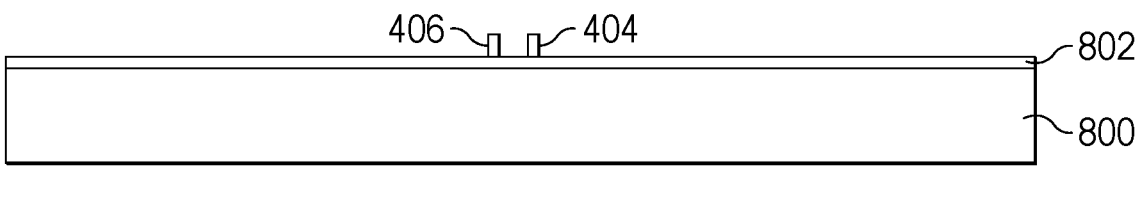
Figure 8D:
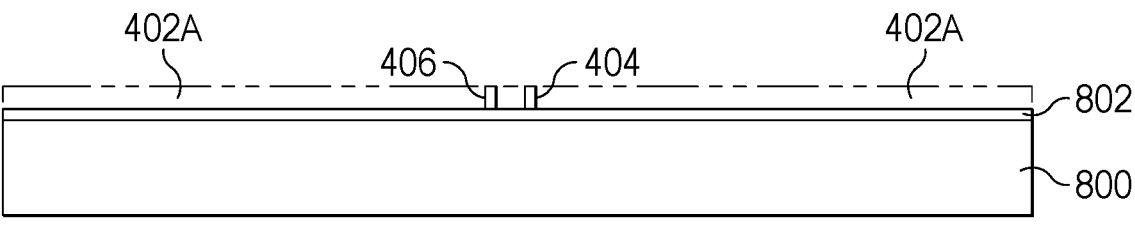
Figures 8E, 8F:
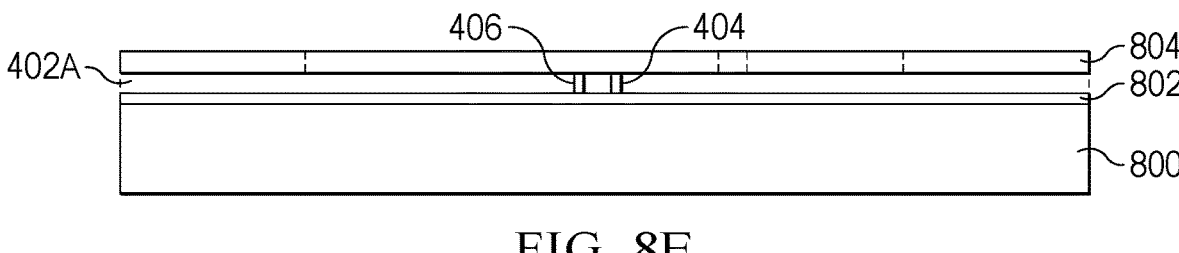
Figures 8G, 8H:
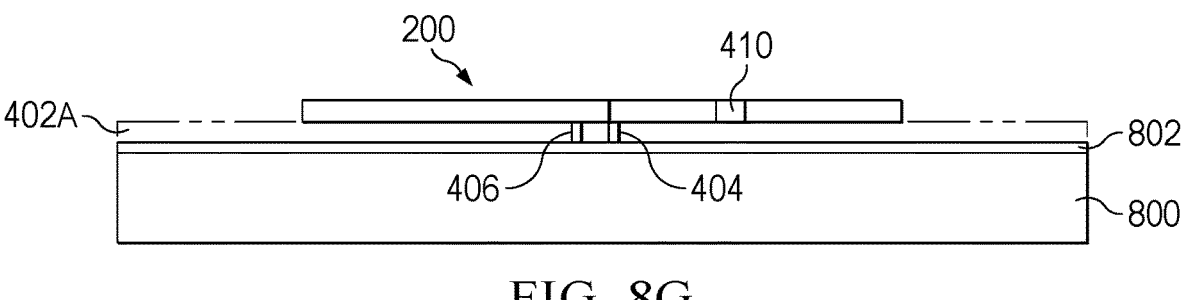
Figures 8I, 8J:
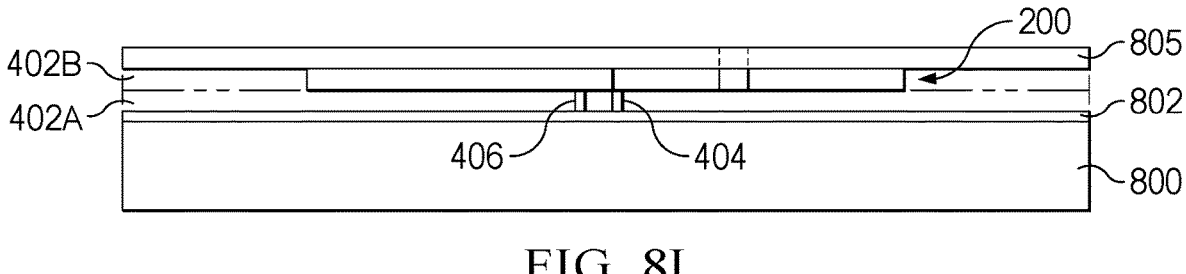
Figure 8K:
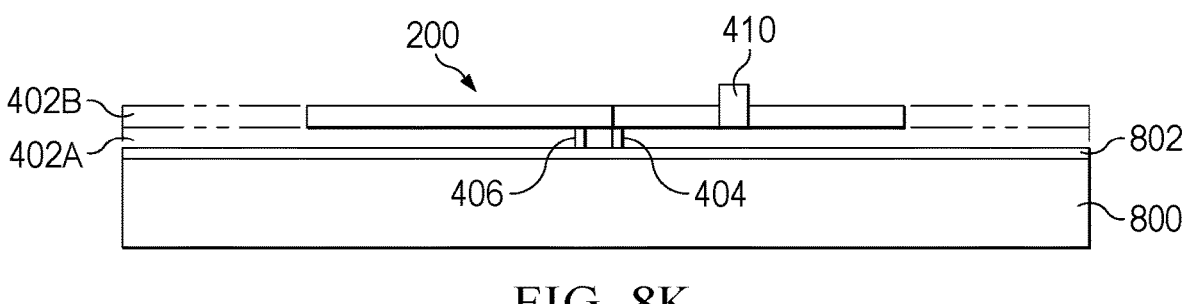
Figure 8L:
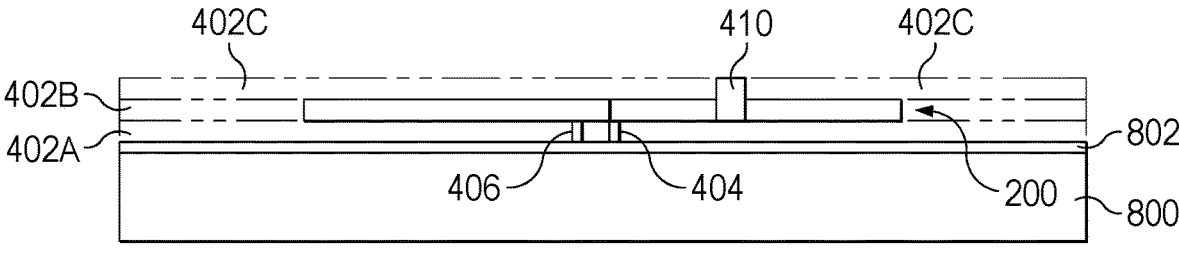
Figure 8M:
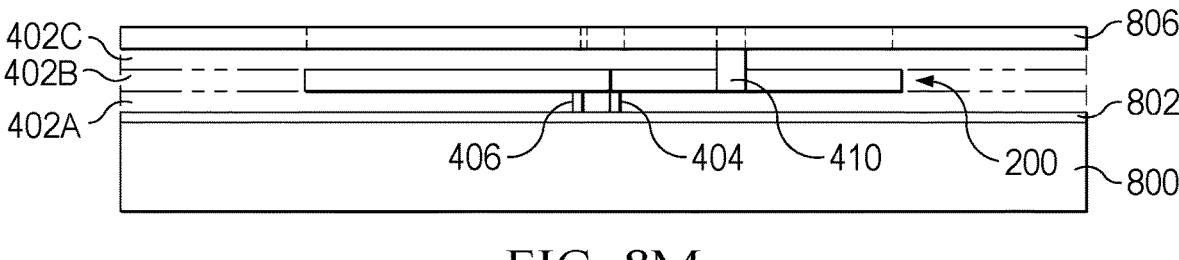
Figure 8N:
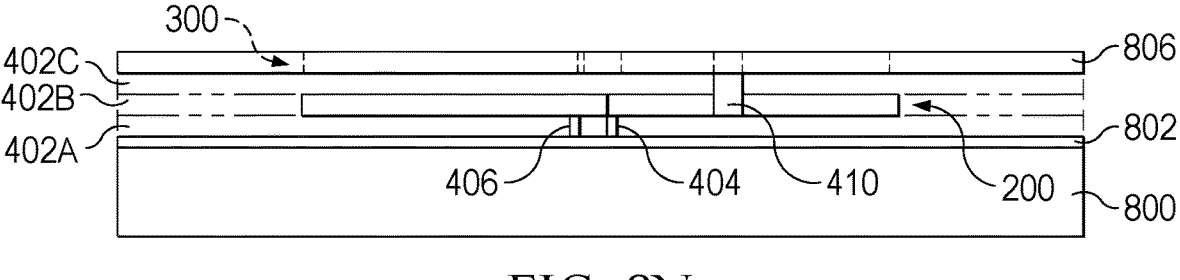
Figure 8O:
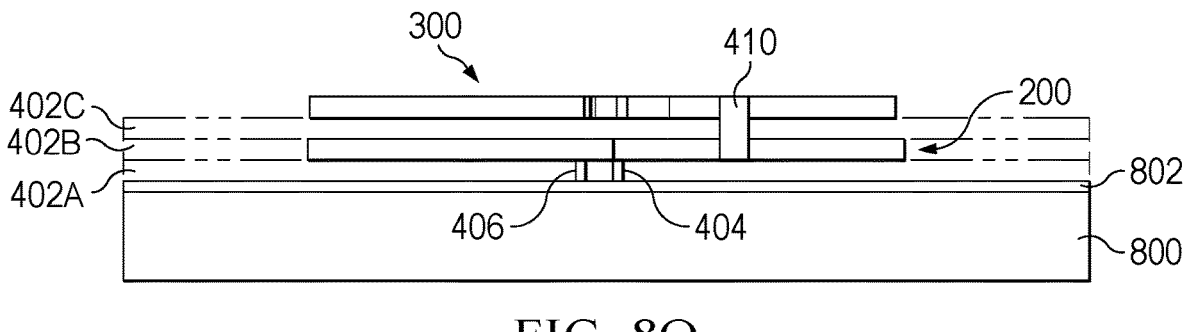
Figure 8P:
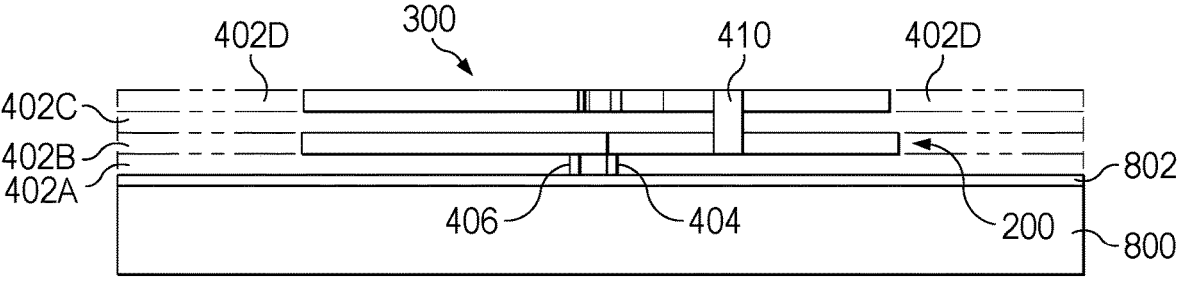
Figures 8Q, 8R:
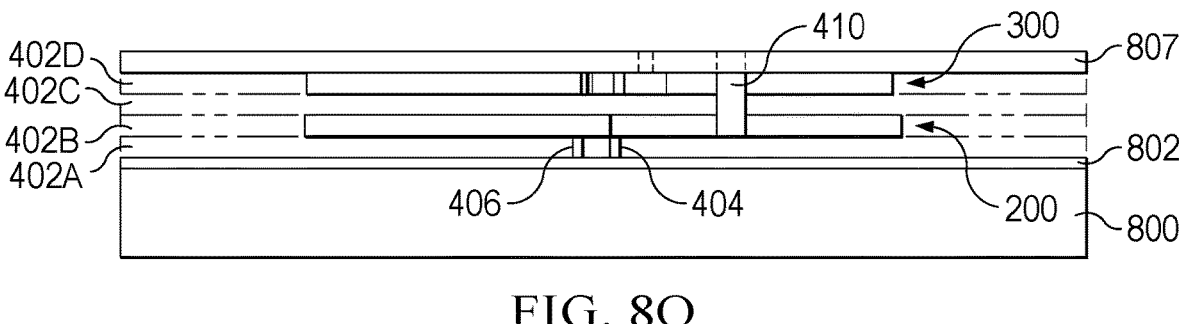
Figure 8S:
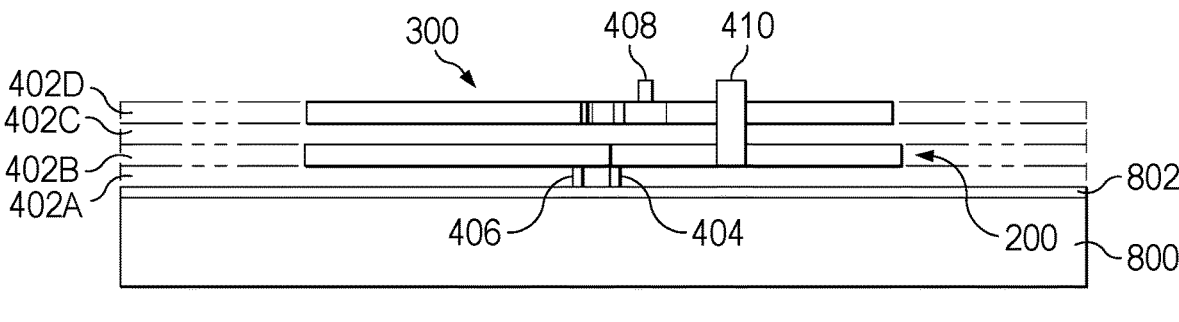
Figure 8T:
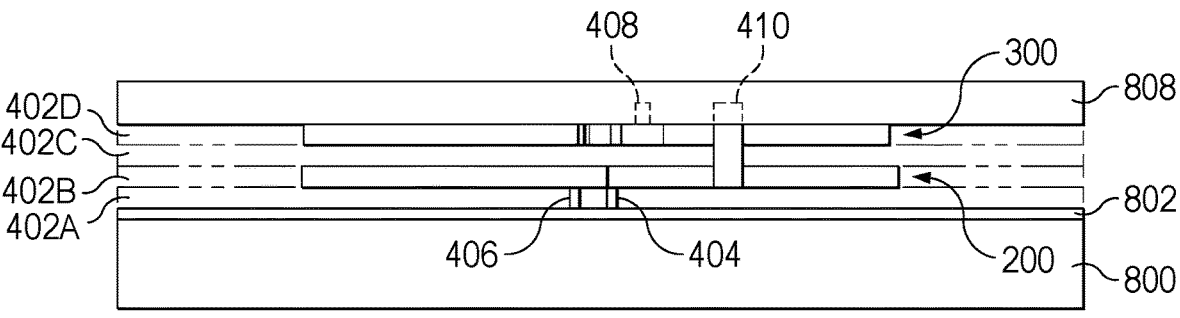
Figure 8U:
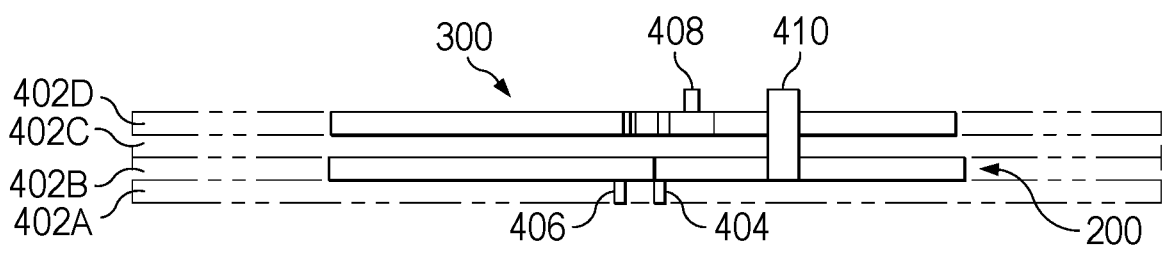
Figure 8V:
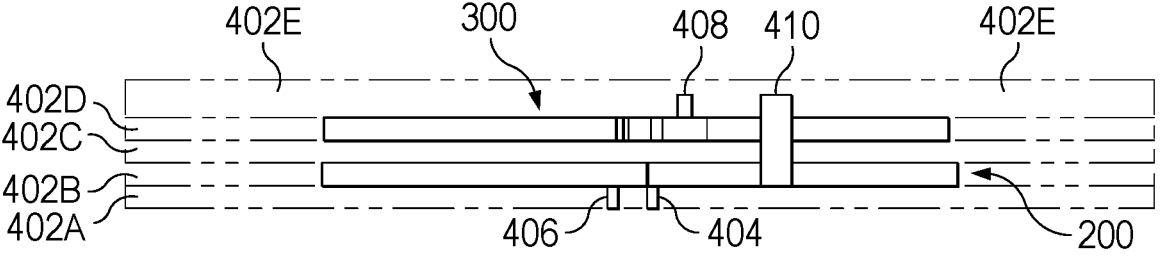
Figure 8W:
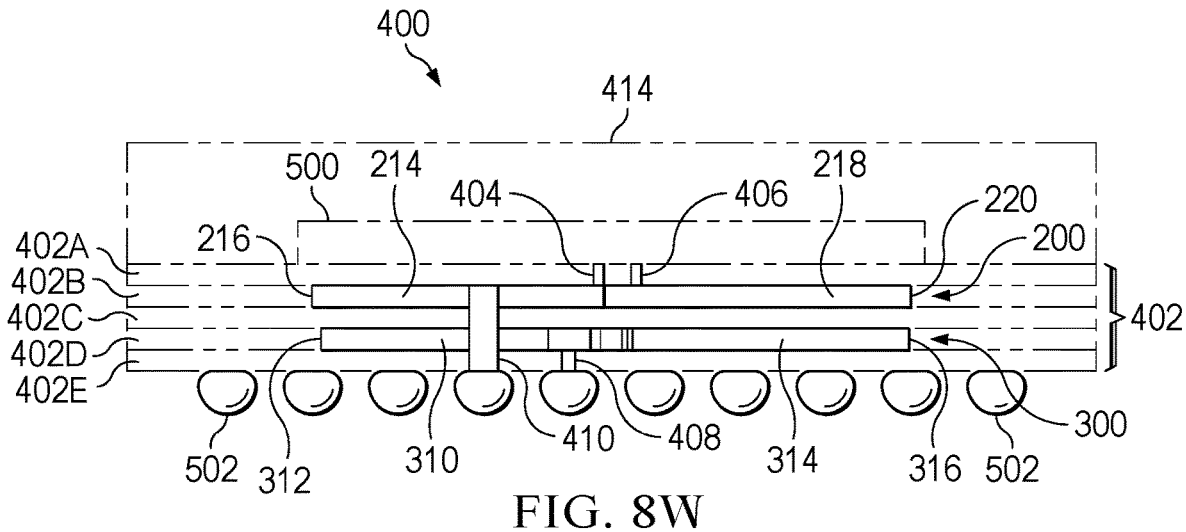

FIG. 7 is a flow diagram of a method 700 for manufacturing a semiconductor package including a coreless substrate having a Marchand balun formed therein, in accordance with various examples. FIGS. 8A-8W are a process flow of a method for manufacturing a semiconductor package including a coreless substrate having a Marchand balun formed therein, in accordance with various examples. Accordingly, FIG. 7 is now described in parallel with FIGS. 8A-8W. Not every step performed in the process flow is expressly depicted in FIGS. 8A-8W. Steps such as certain photolithography steps, certain seed layer applications, etc. may be omitted.

The method 700 begins with plating a pair of differential input vias on a carrier (702). FIG. 8A shows a carrier 800 and seed layer 802 (e.g., a 5-micron seed layer 802 composed of copper). A resist 803 is patterned using a suitable photolithography technique, and as shown in FIG. 8B, vias 404 and 406 are plated in orifices of the resist 803. FIG. 8C shows the resulting structure after the resist 803 has been stripped.

The method 700 includes applying a first laminate layer to the first via and to the carrier (704). FIG. 8D shows the application of a laminate layer (i.e., insulative layer) 402A.

The method 700 includes plating a first metal layer coupled to the first via, the first metal layer having first and second serpentine portions, each of the first and second serpentine portions including multiple segments in parallel with each other (706). FIG. 8E shows the formation of a resist 804 having a suitable pattern for the formation of the metal layer 200, described in detail above. FIG. 8F shows the plating of the metal layer 200. FIG. 8G shows the structure after the resist 804 is stripped.

The method 700 includes applying a second laminate layer to the first metal layer (708). FIG. 8H shows the structure after a second insulative layer (e.g., laminate layer) 402B has been applied.

The method 700 includes applying a third laminate layer to the second laminate layer (710). This third laminate layer does not include either of the metal layers 200, 300, but it may include a portion of the center tap 410. FIG. 8I shows the formation of a resist 805 using suitable photolithography techniques. FIG. 8J shows the plating of the center tap 410 in the resist 805. FIG. 8K shows the structure after the resist 805 has been stripped. FIG. 8L shows the structure after a third laminate layer 402C has been applied.

The method 700 includes plating a second metal layer on the third laminate layer, the second metal layer having third and fourth serpentine portions, each of the third and fourth serpentine portions including multiple segments in parallel with each other (712). FIG. 8M shows the formation of a suitably-patterned resist 806 useful to form the metal layer 300. FIG. 8N shows the plating of the metal layer 300 and the continued formation (e.g., plating) of the center tap 410. FIG. 8O shows the structure after the resist 806 has been stripped.

The method 700 includes applying a fourth laminate layer to the second metal layer (714). FIG. 8P shows an insulative layer (e.g., laminate layer) 402D applied to the structure of FIG. 8O.

The method 700 includes plating a single input via coupled to the second metal layer (716). FIG. 8Q shows the formation of a suitably-patterned resist 807. FIG. 8R shows the plating of the via 408 and the continued formation (e.g., plating) of the center tap 410. FIG. 8S shows the structure after the resist 807 has been stripped.

The method 700 includes applying a fifth laminate layer to the second via (718). FIG. 8T shows a protective dry film 808 applied to the structure of FIG. 8S. The carrier 800 and seed layer 802 is then removed, and the protective dry film 808 is subsequently also removed, producing the structure shown in FIG. 8U. FIG. 8V shows the fifth insulative layer (e.g., laminate layer) 402E applied to the structure of FIG. 8U.

The method 700 includes coupling a semiconductor die to either the pair of differential input vias or to the single via (720). The method 700 includes coupling a conductive terminal of the semiconductor package to either the single via or to the pair of differential input vias (722). The method 700 includes covering the semiconductor die with a mold compound (724). FIG. 8W shows the coupling of the semiconductor die 500, the conductive terminal(s) 502 to corresponding vias, and application of the mold compound 414.

Although the configurations described above included the vias 404, 406 coupled to the semiconductor die 500 and the via 408 coupled to a conductive terminal 502, in some examples, the vias 404, 406 are coupled to conductive terminals 502 and the via 408 is coupled to the semiconductor die 500. Alone or in combination with any other examples described herein, the via 408 may be positioned above the vias 404, 406, and in other examples, the via 408 may be positioned below the vias 404, 406. Alone or in combination with any other examples described herein, the metal layer 200 is positioned above or below the metal layer 300. Alone or in combination with any other examples described herein, the metal layers 200, 300 may be positioned closer to the top of the substrate 402 or closer to the bottom of the substrate 402. Alone or in combination with any other examples described herein, more or fewer layers of the substrate 402 may be included in between the metal layers 200, 300 than the layer 402C. Other variations are contemplated and included in the scope of this disclosure.

Figure 9:
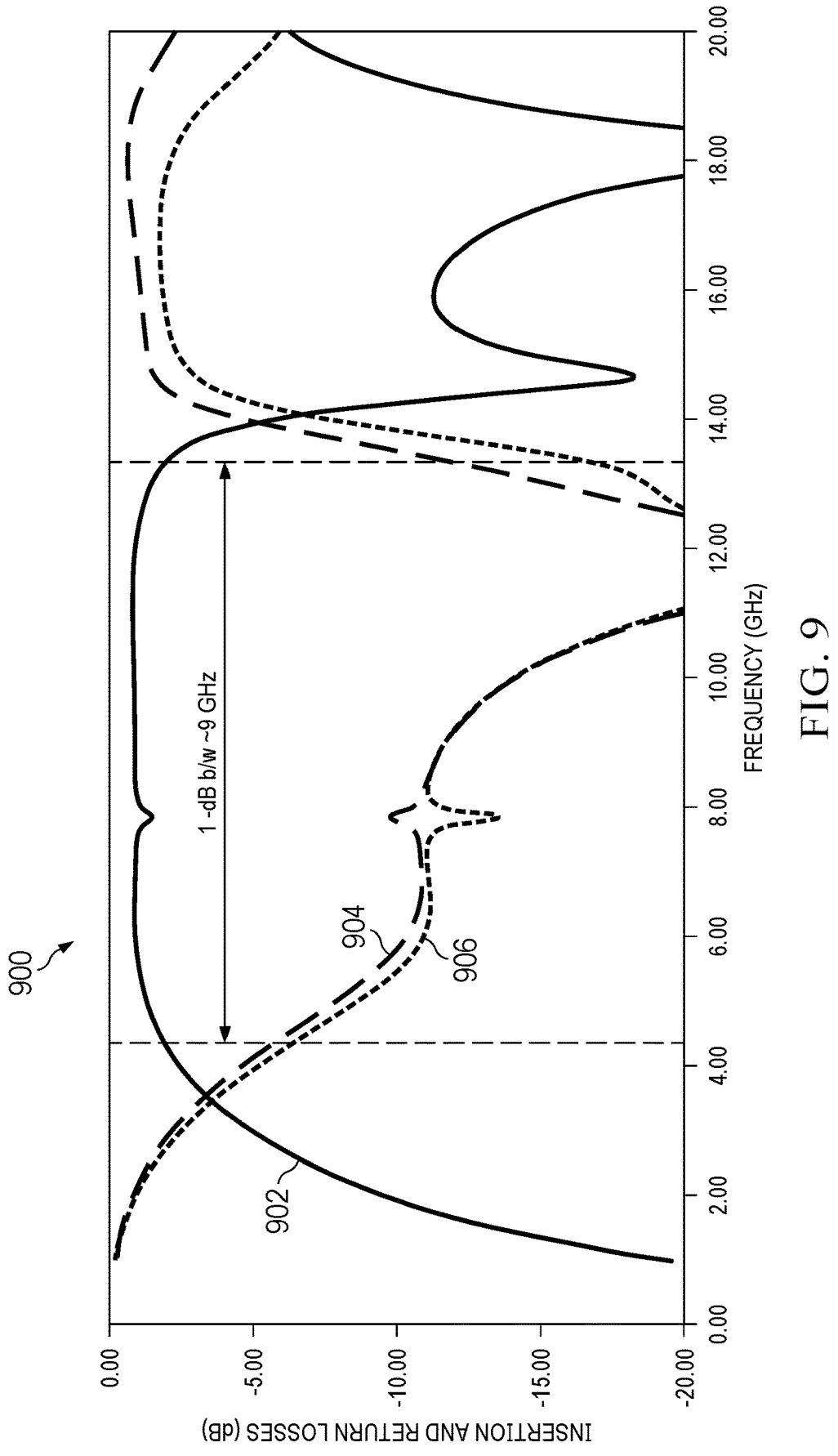
FIG. 9 is a graph depicting insertion loss, return loss of a differential pair, and return loss of a single-ended trace associated with a Marchand balun in a coreless substrate, in accordance with various examples.

FIG. 9 is a graph 900 depicting insertion loss, return loss of a differential pair, and return loss of a single-ended trace associated with a Marchand balun in a coreless substrate, in accordance with various examples. Specifically, the graph 900 includes an x-axis depicting frequency in GHz, and a y-axis depicting insertion and return losses in decibels (dB). A curve 902 depicts insertion loss, while a curve 904 depicts return loss of the differential pair, and a curve 906 depicts return loss of the single-ended trace. The behavior of the curve 902 is notable for its relatively low insertion losses, with approximately 9 GHz of 1-dB insertion loss bandwidth. The behavior of the curve 904 is notable for its 10 dB return loss bandwidth of greater than 7 GHz. The behavior of the curve 906 is notable for its 10 dB return loss bandwidth of greater than 7 GHz.

Figure 10:
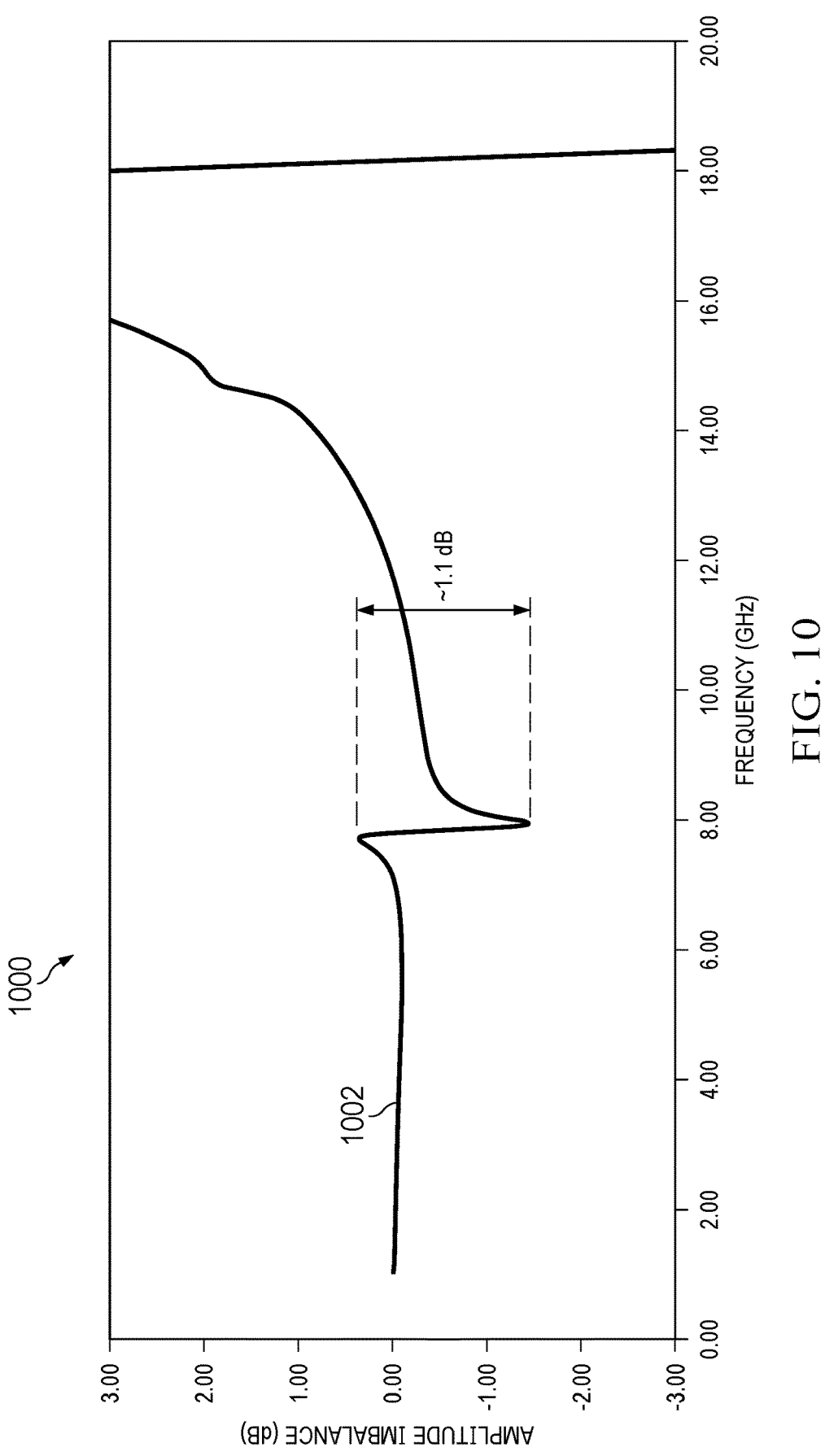
FIG. 10 is a graph depicting amplitude imbalances associated with a semiconductor package including a coreless substrate having a Marchand balun formed therein, in accordance with various examples.

FIG. 10 is a graph 1000 depicting amplitude imbalance associated with a semiconductor package including a coreless substrate having a Marchand balun formed therein, in accordance with various examples. Specifically, the graph depicts frequency in GHz on the x-axis and amplitude imbalance in dB on the y-axis. Curve 1002 demonstrates that in the package 400, an amplitude imbalance (i.e., amplitude imbalance is the difference between S21 and S31 in the dB scale, where S21 is defined as the insertion loss between I/O terminals 210 and 306, and S31 is defined as the insertion loss between I/O terminals 212 and 306) of approximately 1.1 dB may exist within the insertion loss bandwidth of approximately 9 GHz. However, the center tap 410 may be tuned (e.g., by changing the position of the center tap 410 on the trace) to eliminate the resonance at 8 GHz and improve the imbalance.

Figure 11:
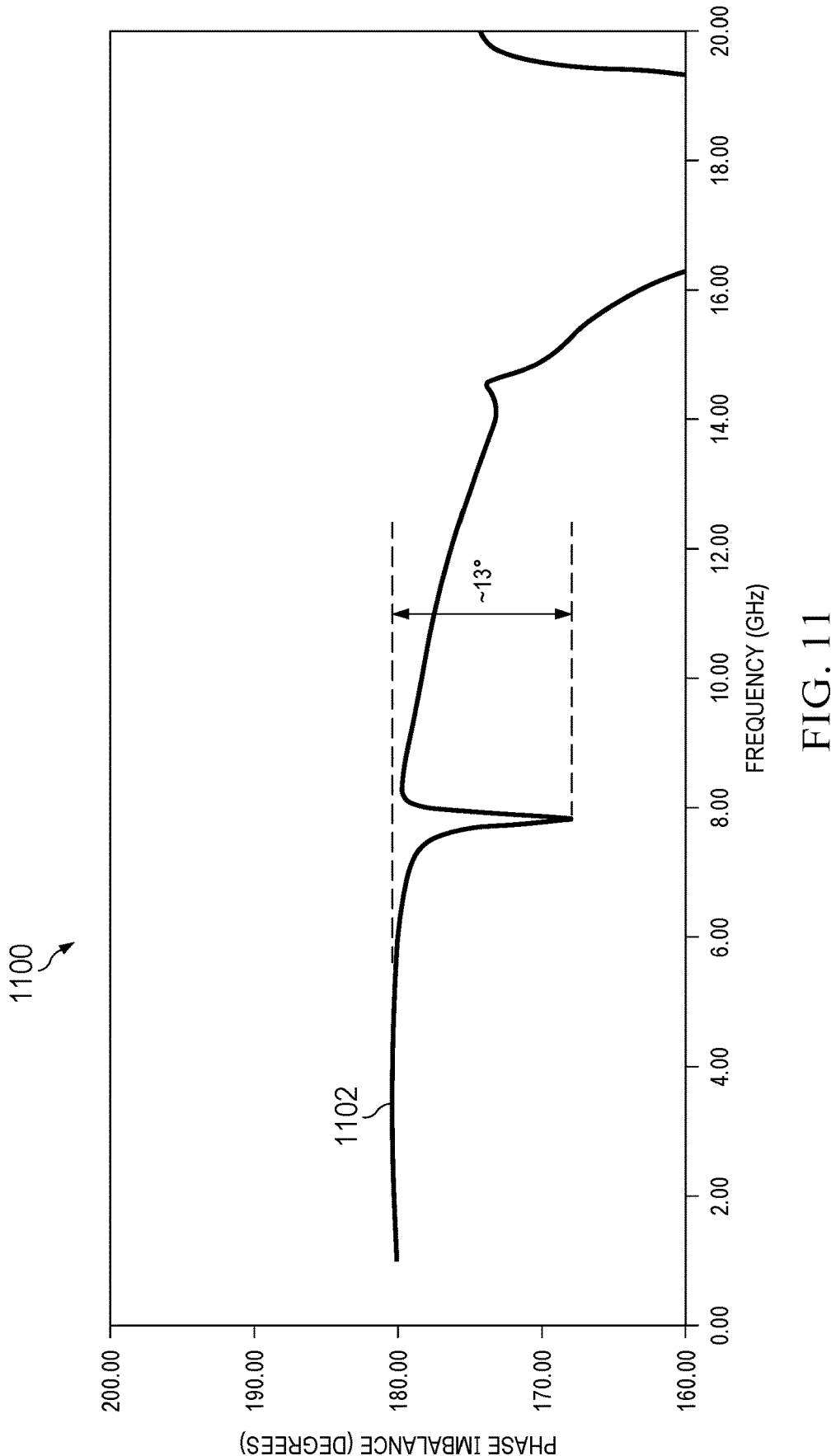
FIG. 11 is a graph depicting phase imbalances associated with a semiconductor package including a coreless substrate having a Marchand balun formed therein, in accordance with various examples

FIG. 11 is a graph 1100 depicting phase imbalances associated with a semiconductor package including a coreless substrate having a Marchand balun formed therein, in accordance with various examples. Specifically, the graph 1100 depicts frequency in GHz on the x-axis and phase imbalance in degrees on the y-axis. Curve 1102 demonstrates that in the package 400, a phase imbalance (i.e., difference in phase of S21 and S31, in degrees) of approximately 13 degrees may exist within the insertion loss bandwidth of approximately 9 GHz. The center tap 410 may be tuned (e.g., by changing the position of the center tap 410 on the trace) to eliminate the resonance at 8 GHz and improve the imbalance.

Figure 12:
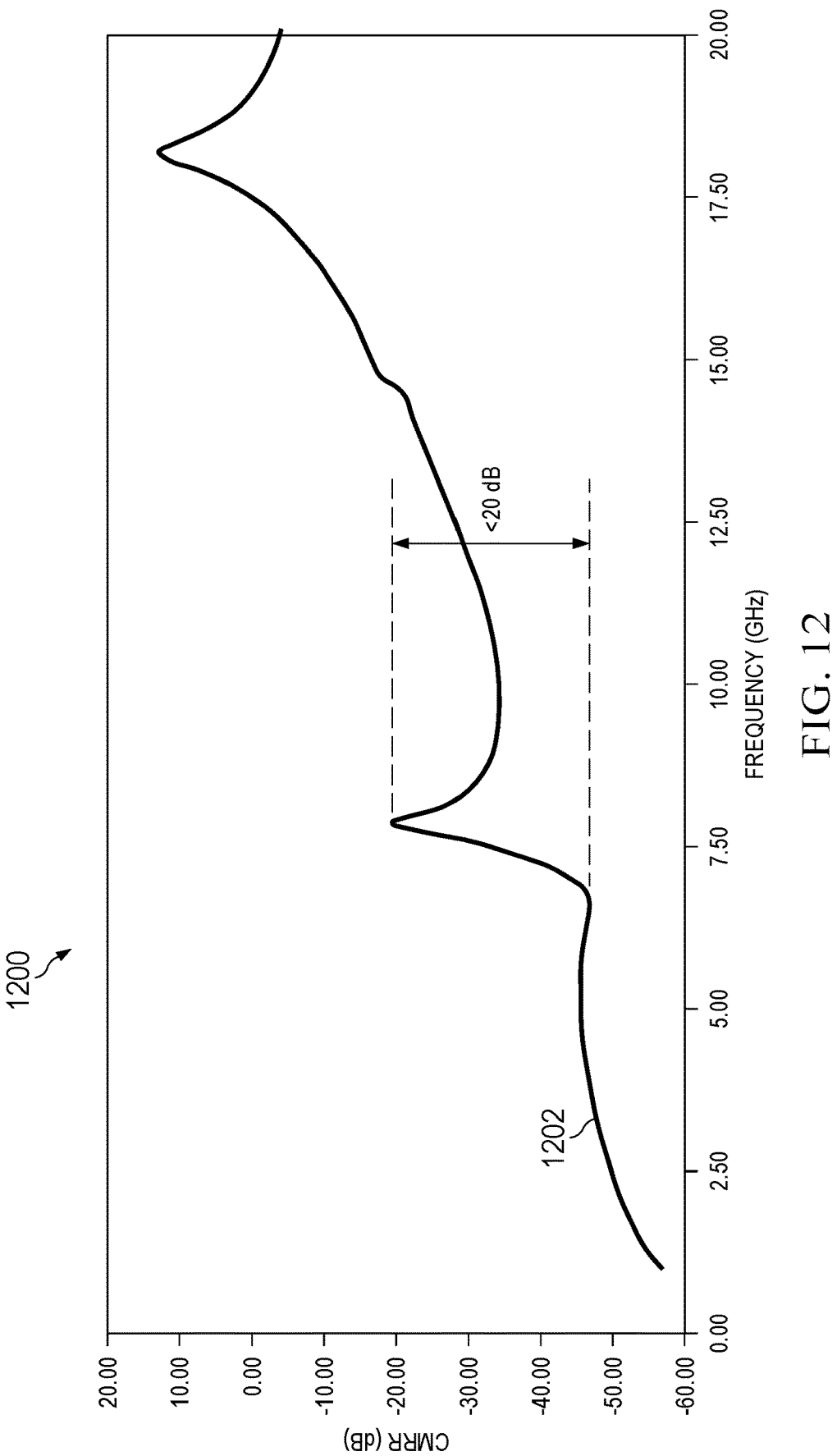
FIG. 12 is a graph depicting common mode rejection ratios (CMRRs) associated with a semiconductor package including a coreless substrate having a Marchand balun formed therein, in accordance with various examples.

FIG. 12 is a graph 1200 depicting common mode rejection ratios (CMMRs) associated with a semiconductor package including a coreless substrate having a Marchand balun formed therein, in accordance with various examples. Specifically, the graph 1200 depicts frequency in GHz on the x-axis and common mode rejection ratio on the y-axis in dB. Curve 1202 demonstrates that in the package 400, a common mode rejection ratio is less than 20 dB within the insertion loss bandwidth of approximately 9 GHz. The center tap 410 may be tuned to eliminate the resonance at 8 GHz and improve the imbalance.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Uses of the term "ground" or variations thereof in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:
1. A semiconductor package, comprising:
a conductive terminal;
a semiconductor die including a device side having circuitry formed therein, the device side facing toward the conductive terminal; and a substrate coupled to the conductive terminal and to the device side of the semiconductor die, the substrate including:

a first metal layer coupled to first and second vias extending toward and coupled to either the device side of the semiconductor die or the conductive terminal; and a second metal layer electrically isolated from the first metal layer by an insulation layer between the first and second metal layers, the second metal layer coupled to a third via extending toward and coupled to either the conductive terminal or the semiconductor die, wherein the first and second metal layers form a Marchand balun.

2. The semiconductor package of claim 1, wherein the first metal layer includes a first portion including multiple segments in parallel with each other, and wherein the first metal layer includes a second portion including multiple segments in parallel with each other.

3. The semiconductor package of claim 2, wherein the first portion includes a first segment in parallel with a second segment of the second portion.

4. The semiconductor package of claim 2, wherein a segment in the first portion has a width that is less than a width of a segment in the second portion.

5. The semiconductor package of claim 1, wherein the second metal layer includes a first portion including multiple segments in parallel with each other, and wherein the second metal layer includes a second portion including multiple segments in parallel with each other.

6. The semiconductor package of claim 5, wherein a first end of the first portion and a second end of the second portion are coupled to each other.

7. The semiconductor package of claim 1, wherein the substrate is a coreless substrate.

8. A semiconductor package, comprising:

a conductive terminal;

a semiconductor die including a device side having circuitry formed therein, the device side facing toward the conductive terminal; and a substrate coupled to the conductive terminal and to the device side of the semiconductor die, the substrate including:

a first metal layer having a differential input extending toward and coupled to either the conductive terminal or the semiconductor die, the first metal layer having a first serpentine portion including multiple segments in parallel with each other and a second serpentine portion including multiple segments in parallel with each other, the first serpentine portion including multiple segments in parallel with multiple segments in the second serpentine portion, the first and second serpentine portions having ends coupled to each other; and a second metal layer having a single input extending toward and coupled to either the semiconductor die or the conductive terminal, the second metal layer having a third serpentine portion including multiple segments in parallel with each other and a fourth serpentine portion including multiple segments in parallel with each other, the third serpentine portion including multiple segments in parallel with multiple segments in the fourth serpentine portion, the third and fourth serpentine portions having ends coupled to each other, the first serpentine portion vertically aligned with the third serpentine portion and the second serpentine portion vertically aligned with the fourth serpentine portion.

9. The semiconductor package of claim 8, wherein the first and second metal layers form a Marchand balun.

10. The semiconductor package of claim 8, wherein a width of a segment in the first serpentine portion is less than a width of a segment in the second serpentine portion.

11. The semiconductor package of claim 10, wherein a width of a segment in the third serpentine portion is less than a width of a segment in the fourth serpentine portion.

12. The semiconductor package of claim 11, wherein a ratio of the width of the first serpentine portion to the width of the second serpentine portion is greater than a ratio of the width of the third serpentine portion to the width of the fourth serpentine portion.

13. The semiconductor package of claim 8, wherein the substrate is a coreless substrate.

* * * * *